US011101326B2

(12) United States Patent
Nardi et al.

(10) Patent No.: US 11,101,326 B2
(45) Date of Patent: Aug. 24, 2021

(54) METHODS OF FORMING A PHASE CHANGE MEMORY WITH VERTICAL CROSS-POINT STRUCTURE

(71) Applicant: SanDisk Technologies LLC, Addison, TX (US)

(72) Inventors: Federico Nardi, San Jose, CA (US); Christopher J Petti, Mountain View, CA (US); Gerrit Jan Hemink, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/896,946

(22) Filed: Jun. 9, 2020

(65) Prior Publication Data
US 2020/0303459 A1    Sep. 24, 2020

Related U.S. Application Data

(62) Division of application No. 15/869,573, filed on Jan. 12, 2018.
(Continued)

(51) Int. Cl.
*H01L 27/24*    (2006.01)
*H01L 45/00*    (2006.01)
(Continued)

(52) U.S. Cl.
CPC ........ *H01L 27/249* (2013.01); *G11C 11/5678* (2013.01); *G11C 13/004* (2013.01);
(Continued)

(58) Field of Classification Search
CPC ... H01L 27/249; H01L 45/06; H01L 27/2463; H01L 27/2454; H01L 45/1233;
(Continued)

(56) References Cited

U.S. PATENT DOCUMENTS 6,087,674 A    7/2000  Ovshinsky et al.
7,515,455 B2   4/2009  Nirshl et al.
(Continued)

OTHER PUBLICATIONS

Dan Gao et al., The Effect of Ti-Rich TiN Film on Thermal Stability of Ge2Sb2Te5 for Phase Change Memory, ECS Journal of Solid State Science and Technology, 5 (5), p. 245-p. 249, 2016 . (Year: 2016).*

(Continued)

*Primary Examiner* — Charles D Garber
*Assistant Examiner* — S M Sohel Imtiaz
(74) *Attorney, Agent, or Firm* — Vierra Magen Marcus LLP

(57) ABSTRACT

A non-volatile memory uses phase change memory (PCM) cells in a three dimensional vertical cross-point structure, in which multiple layers of word lines run in a horizontal direction and bit lines run in a vertical direction. The memory cells are located in a recessed region of the word lines and are separated from the bit line by an ovonic threshold switch. A surfactant lining of the word line recess in which the phase change memory material is placed improves stability of the resistance state of the memory cells, allowing for improved multi-state operation.

20 Claims, 27 Drawing Sheets

Related U.S. Application Data

(60) Provisional application No. 62/572,831, filed on Oct. 16, 2017.

(51) Int. Cl.
*G11C 13/00* (2006.01)
*G11C 11/56* (2006.01)
*H01L 29/786* (2006.01)

(52) U.S. Cl.
CPC ...... *G11C 13/0004* (2013.01); *G11C 13/0069* (2013.01); *G11C 13/0097* (2013.01); *H01L 27/2427* (2013.01); *H01L 27/2454* (2013.01); *H01L 27/2463* (2013.01); *H01L 45/06* (2013.01); *H01L 45/1233* (2013.01); *H01L 45/1253* (2013.01); *H01L 45/144* (2013.01); *H01L 45/1683* (2013.01); *G11C 13/0064* (2013.01); *G11C 2013/005* (2013.01); *G11C 2013/0092* (2013.01); *G11C 2213/51* (2013.01); *G11C 2213/52* (2013.01); *G11C 2213/71* (2013.01); *G11C 2213/75* (2013.01); *G11C 2213/76* (2013.01); *G11C 2213/79* (2013.01); *H01L 29/78642* (2013.01)

(58) Field of Classification Search
CPC ........... H01L 29/78642; H01L 45/1683; H01L 45/1253; H01L 45/144; G11C 11/5678; G11C 13/0004; G11C 2213/75; G11C 11/0069; G11C 11/0097
See application file for complete search history.

(56) References Cited

U.S. PATENT DOCUMENTS

| | | | |
|---|---|---|---|
| 7,728,319 B2 | 6/2010 | Goux et al. | |
| 7,888,668 B2 | 2/2011 | Kuo et al. | |
| 8,411,477 B2 | 4/2013 | Tang et al. | |
| 9,252,362 B2 | 2/2016 | Pio | |
| 9,570,516 B2 | 2/2017 | Shepard | |
| 9,595,669 B2 | 3/2017 | Bonhote et al. | |
| 10,262,730 B1 | 4/2019 | Petti et al. | |
| 10,374,014 B2 | 8/2019 | Petti et al. | |
| 2004/0150966 A1 | 8/2004 | Hu | |
| 2004/0168927 A1 | 9/2004 | Matsushita | |
| 2006/0019495 A1* | 1/2006 | Marcadal | H01L 21/28079 438/683 |
| 2006/0221712 A1* | 10/2006 | Lowrey | G11C 13/004 365/189.07 |
| 2007/0227878 A1* | 10/2007 | Hamamjy | H01L 45/1625 204/192.12 |
| 2007/0279962 A1* | 12/2007 | Nirschl | G11C 13/0069 365/148 |
| 2008/0099326 A1* | 5/2008 | Ye | C23C 14/0623 204/192.25 |
| 2008/0157053 A1 | 7/2008 | Lai et al. | |
| 2010/0012916 A1* | 1/2010 | Kuo | H01L 45/06 257/4 |
| 2010/0163818 A1* | 7/2010 | Lee | H01L 45/1641 257/2 |
| 2010/0188892 A1* | 7/2010 | Baks | H01L 45/06 365/163 |
| 2011/0037042 A1* | 2/2011 | Breitwisch | H01L 27/2436 257/2 |
| 2011/0260237 A1* | 10/2011 | Lee | H01L 27/11551 257/325 |
| 2011/0299314 A1* | 12/2011 | Samachisa | G11C 13/003 365/51 |
| 2014/0198565 A1 | 7/2014 | Pellizzer et al. | |
| 2014/0374688 A1* | 12/2014 | Wu | H01L 27/2445 257/4 |
| 2015/0243884 A1 | 8/2015 | BrightSky et al. | |
| 2016/0019953 A1 | 1/2016 | Ratnam et al. | |
| 2016/0019963 A1* | 1/2016 | Yan | G11C 13/0007 365/148 |
| 2016/0300885 A1* | 10/2016 | Konevecki | H01L 27/2454 |
| 2017/0148851 A1* | 5/2017 | Hsu | H01L 43/08 |
| 2017/0309819 A1 | 10/2017 | Wu et al. | |
| 2018/0277597 A1* | 9/2018 | Arayashiki | H01L 27/249 |
| 2019/0115391 A1 | 4/2019 | Petti et al. | |

OTHER PUBLICATIONS

Burr, Geoffrey W., et al., "Phase change memory technology," Journal of Vacuum Science and Technology B, vol. 28, issue 2, 49 pages.

Boniardi, Mattia, et al., "Physical origin of the resistance drift exponent in amorphous phase change materials," Applied Physics Letters 98, Jun. 2011, 4 pages.

Kato, Sho, et al., "Analysis of Bit Cost and Performance for Stacked Type Chain PRAM," Contemporary Engineering Sciences, vol. 6, No. 4, Jun. 2013, 11 pages.

Kau, Derchang, "A Survey of Cross Point Phase Change Memory Technologies," Sematech International Symposium on Advanced Gate Stack Technology, Troy, NY, Sep. 2010, 28 pages.

Kim, S., et al., "A Phase Change Memory Cell with Metallic Surfactant Layer as a Resistance Drift Stabilizer," IEEE International Electron Devices Meeting (IEDM), Dec. 2013, 4 pages.

Kinoshita, M., et al., "Scalable 3-D vertical chain-cell-type phase-change memory with 4F2 poly-Si diodes," Symposium on VLSI Technology Digest of Technical Papers, Jun. 2012, 2 pages.

Redaelli, Andrea, "Crossbar architecture for Non-Volatile Memories," Numonyx B.V., Mar. 2010, 66 pages.

Ovshinsky, Stanford R., "Reversible Electrical Switching Phenomena in Disordered Structures," Physical Review Letters, vol. 21, No. 20, Nov. 1968, 6 pages.

Papandreou, N., et al., "Programming Algorithms for Multilevel Phase-Change Memory," IEEE International Symposium on Circuits and Systems (ISCAS), May 2011, 4 pages.

Burr, Geoffrey W., et al., "Recent Progress in Phase-CHange Memory Technology," IEEE Journal on Emerging and Selected Topics in Circuits and Systems, vol. 6, Issue 2, Jun. 2016.

Wong, H.-S. Philip, et al., "Phase Change Memory," Proceedings on the IEEE, vol. 98, No. 12, Dec. 2010, 27 pages.

Non-final Office Action dated Sep. 11, 2018, U.S. Appl. No. 151869,553, filed Jan. 12, 2018.

Response to Non-final Office Action dated Dec. 5, 2018, U.S. Appl. No. 15/869,553, filed Jan. 12, 2018.

Notice of Allowance dated Jan. 17, 2019, U.S. Appl. No. 15/869,553, filed Jan. 12, 2018.

Non-final Office Action dated Jan. 7, 2019, U.S. Appl. No. 15/869,592, filed Jan. 12, 2018.

Response to Office Action dated Feb. 26, 2019, U.S. Appl. No. 15/869,592, filed Jan. 12, 2018.

Final Office Action dated Mar. 21, 2019, U.S. Appl. No. 15/869,592, filed Jan. 12, 2018.

Response to Office Action dated May 29, 2019, U.S. Appl. No. 15/869,592, filed Jan. 12, 2018.

Notice of Allowance dated Jun. 11, 2019, U.S. Appl. No. 15/869,592, filed Jan. 12, 2018.

Restriction Requirement dated Apr. 2, 2019, U.S. Appl. No. 15/869,573, filed Jan. 12, 2018.

Response to Restriction Requirement dated May 22, 2019, U.S. Appl. No. 15/869,573, filed Jan. 12, 2018.

Non-final Office Action dated Sep. 4, 2019, U.S. Appl. No. 15/869,573, filed Jan. 12, 2018.

Response to Office Action dated Nov. 22, 2019, U.S. Appl. No. 15/869,573, filed Jan. 12, 2018.

Non-final Office Action dated Mar. 11, 2020, U.S. Appl. No. 15/869,573, filed Jan. 12, 2018.

Response to Office Action dated May 28, 2020, U.S. Appl. No. 15/869,573, filed Jan. 12, 2018.

Response to Final Office Action dated Oct. 30, 2020, U.S. Appl. No. 15/869,573, filed Jan. 12, 2018.

(56) References Cited

OTHER PUBLICATIONS

Final Office Action dated Sep. 10, 2020, U.S. Appl. No. 15/869,573, filed Jan. 12, 2018.
Non-final Office Action dated Dec. 24, 2020, U.S. Appl. No. 15/869,573, filed Jan. 12, 2018.
Response to Office Action dated Mar. 23, 2021, U.S. Appl. No. 15/869,573, filed Jan. 12, 2018.

* cited by examiner

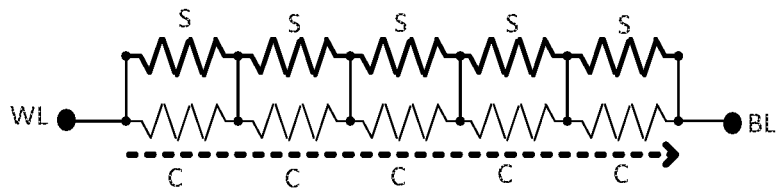
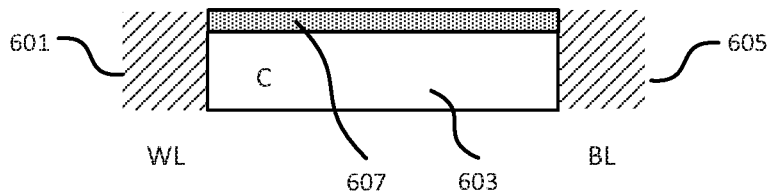
FIG. 6A
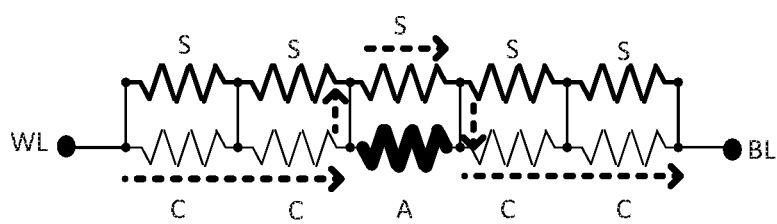
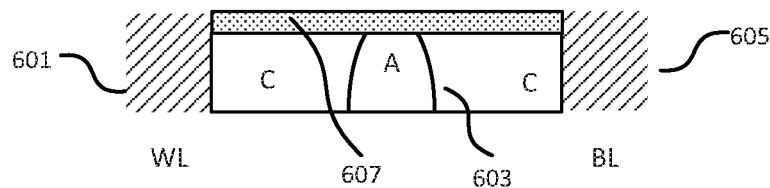
FIG. 6B
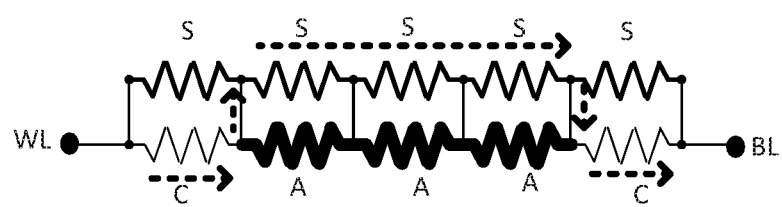
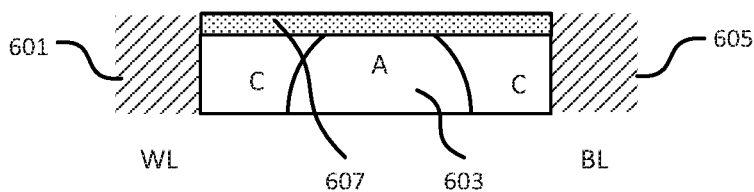
FIG. 6C

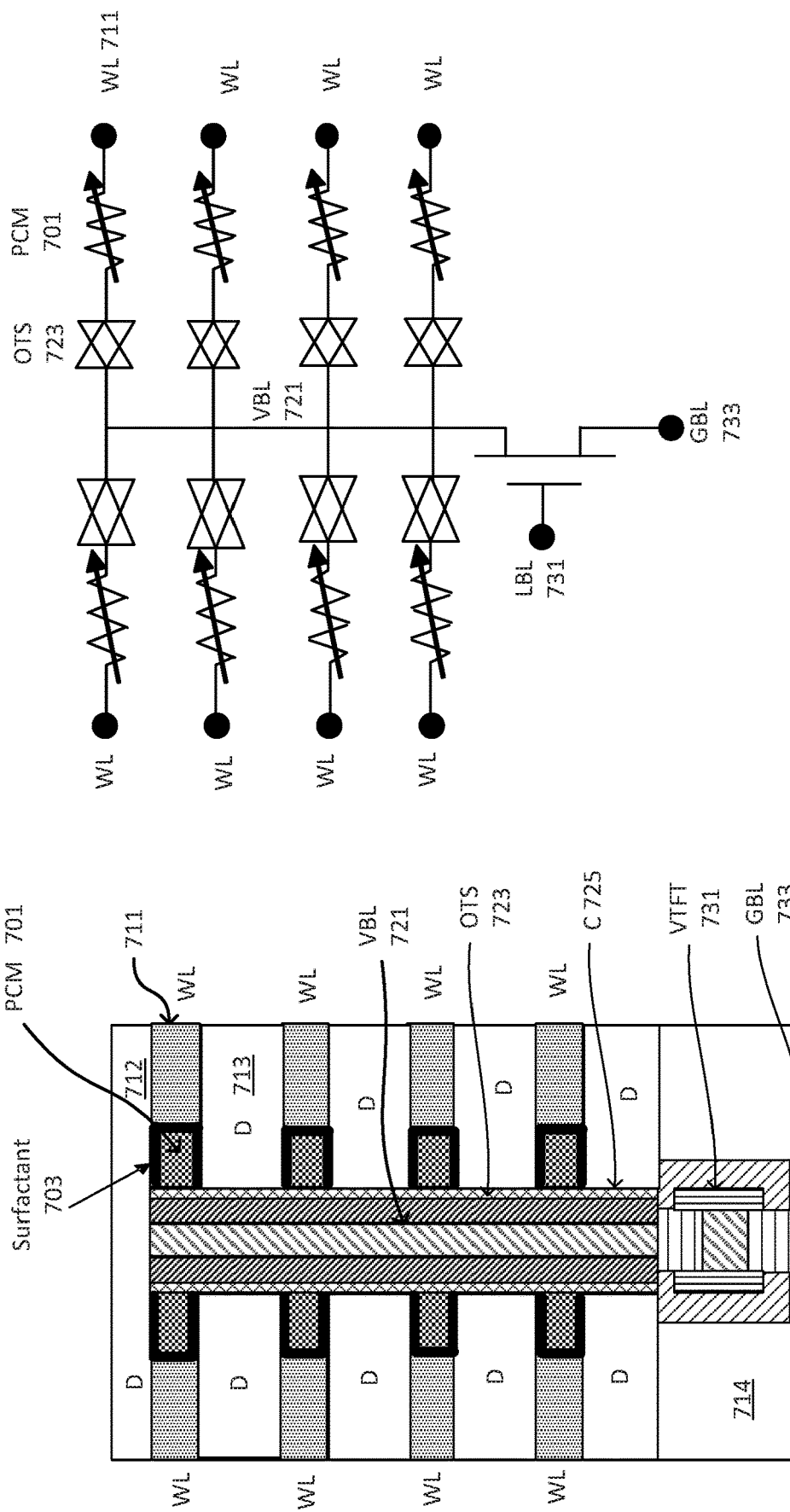

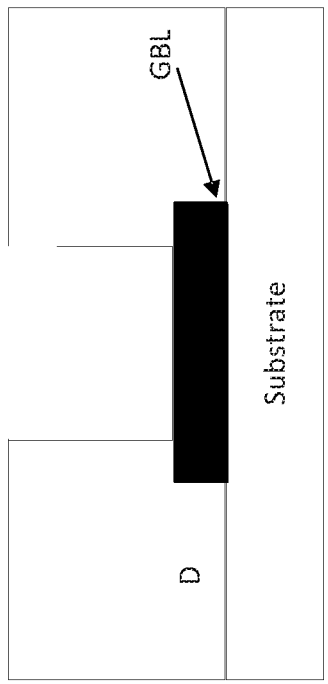
FIG. 11C
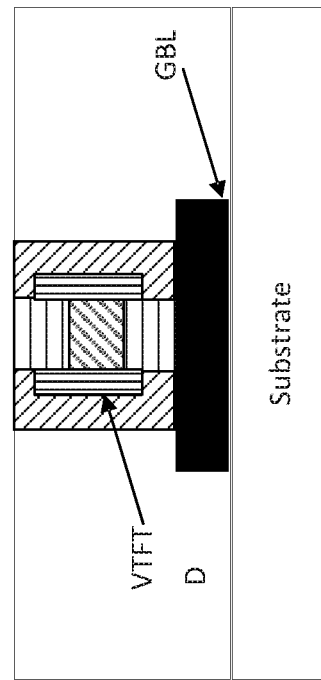
FIG. 11D
FIG. 11A
FIG. 11B

METHODS OF FORMING A PHASE CHANGE MEMORY WITH VERTICAL CROSS-POINT STRUCTURE

CLAIM OF PRIORITY

This application is a divisional application of U.S. patent application Ser. No. 15/869,573, filed Jan. 12, 2018 and published as US 2019/0115391 on Apr. 18, 2019, which claims the benefit of U.S. Provisional Patent Application Ser. No. 62/572,831, filed Oct. 16, 2017, both of which are incorporated by reference herein in their entirety for all purposes.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PCM). In recent years, non-volatile memory devices have been scaled in order to reduce the cost per bit. However, as process geometries shrink, many design and process challenges are presented. These challenges include increased variability in memory cell characteristics over process, voltage, and temperature variations and increased leakage currents through unselected memory cells.

BRIEF DESCRIPTION OF THE DRAWINGS

FIGS. 6A-C illustrate a phase change memory (PCM) memory cell with multiple resistance levels.

FIG. 7A is cross-sectional side view that shows one embodiment of a vertical cross-point memory structure with recessed PCM memory cells.

FIG. 8 is an equivalent circuit diagram representation of the memory structure of FIG. 7A.

FIGS. 11A-11L illustrate various processing stages for the memory structure of FIGS. 7A and 7B.

DETAILED DESCRIPTION

Figure 1A:
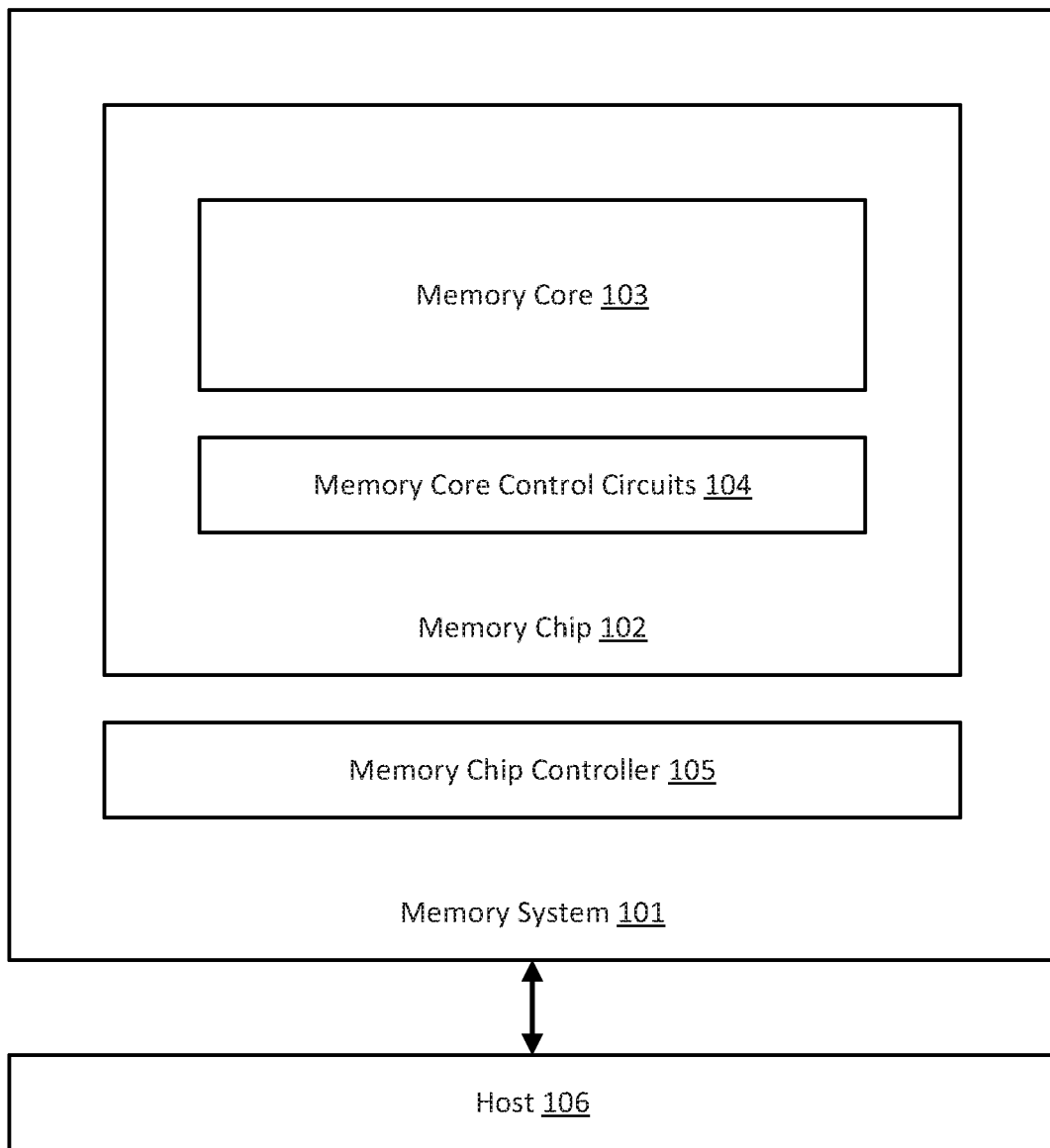
FIGS. 1A-1F depict various embodiments of a memory system.

A non-volatile memory uses phase change memory (PCM) cells in a three dimensional vertical cross-point structure, in which multiple layers of word lines run in a horizontal direction and bit lines run in a vertical direction. The memory cells are located in a recessed pocket region, or "pore", of the word lines and are separated from the bit line by an ovonic threshold switch or other selector device. A surfactant lining of the word line pocket in which the phase change memory material is confined improves stability of the resistance state of the memory cells, allowing for improved multi-state operation.

A phase change memory material, such as a chalcogenide material like $Ge_2Sb_2Te_5$ (GST), may change phases from an amorphous state (e.g., corresponding with a high resistance "reset" state) to a crystalline state (e.g., corresponding with a low resistance "set" state) or from a less-ordered crystalline state to a more-ordered crystalline state. The PCM material may initially be in a crystalline phase, low-resistance state after fabrication. Thereafter, the PCM material or portion of the PCM material may be reset into an amorphous phase, high-resistance state by melting a portion of the PCM material and then quickly quenching the portion of the PCM material by applying a current pulse through the PCM material for a first period of time. The amorphous portion of the PCM material in series with any crystalline region of the PCM material may determine the effective resistance of the PCM material. One side of the PCM material may connect to a first electrode, such as a word line, and a portion on the other side may connect to a second electrode, such as a bit line. The current passing through the PCM material may cause a substantial amount of heat to be generated due to current. The amount of heat generated may be proportional to the amount of current passing through the memory cell. The PCM material may be set into a crystalline phase, low-resistance state by applying a current pulse to the PCM material to anneal the amorphous portion of the PCM material at a temperature between the crystallization temperature for the PCM material and the melting temperature for the PCM material for a second period of time to crystallize the amorphous portion of the PCM material. The second period for setting the PCM material may be greater than the first period of time for resetting the PCM material.

By varying the amount of the PCM material that is in the amorphous state relative to the crystalline state, multi-state data can be stored in a PCM material based memory cell. For example, starting in the crystalline state pulses of different current levels can program the memory cell into different data states by placing different amounts of the memory cell's PCM material in the amorphous state. As the resistivity of the amorphous state tends to be relatively unstable with respect to temperature or other conditions, the number of states that can be practically stored in a PCM based memory cell can be limited. To improve this situation, the PCM material can be formed within a confined pocket or pore structure that is lined with a surfactant. If the surfactant has a relatively stable resistivity that is higher than the crystalline state, but lower than amorphous state, the surfactant can provide a parallel current path around the amorphous region, allowing for more stable multi-state memory cell than using the PCM material alone.

In some embodiments, a memory array may comprise a cross-point memory array structure. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. In some cases, each memory cell in a cross-point memory array may be placed in series with a selection device acting as a steering element or an isolation element, such as a diode or ovonic threshold switch, in order to reduce leakage currents. The structure can be formed as a series of alternating dielectric and word line layers, where the word lines layers can have a series of prongs, forming a crested comb-like structure. From the holes or openings etched down into the dielectric layers for the bit lines, the prongs can be etched back to form the pocket or pore region that can be lined with the surfactant and then filed with the phase change memory material for each of the memory cells. The vertical bit line structure, along with the ovonic or other selection switches, can then be formed to with the holes.

In some embodiments, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes PCM material having a reversible resistance-switching element that can be programmed to multiple resistance levels.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate. In some embodiments, the multi-state memory pPCM memory cells can be read by using a current mirror to compare the current running through the cells in response to different voltage levels with a reference current. In some embodiments, multi-state data can be written to the phase change memory material based memory cell by using a current mirror to apply current pulses of different amplitudes to the memory cell.

FIG. 1A depicts one embodiment of a host 106 and a memory system 101 in which the phase change memory can be implemented. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high-density MLC (multi-level, or multi-state, cell) SSD (e.g., 2-bits/cell or 3-bits/cell) or a high performance SLC (single level cell) SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
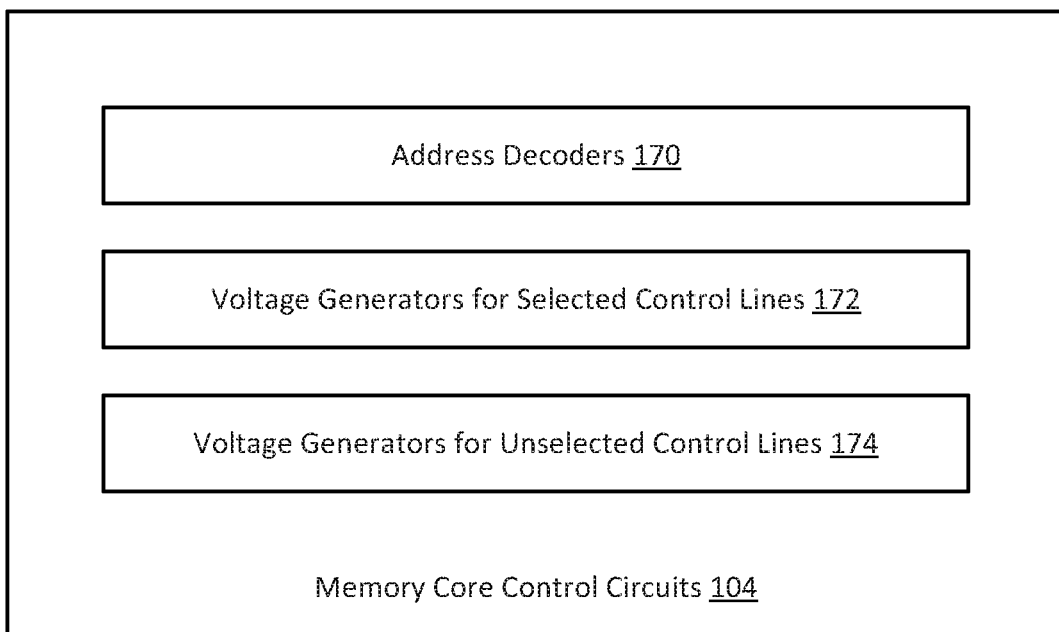

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
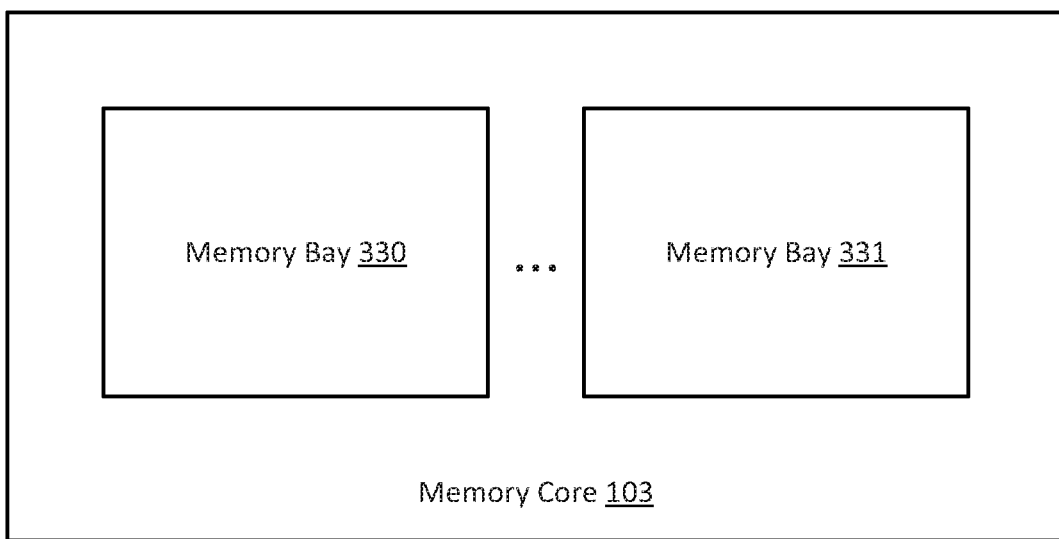

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
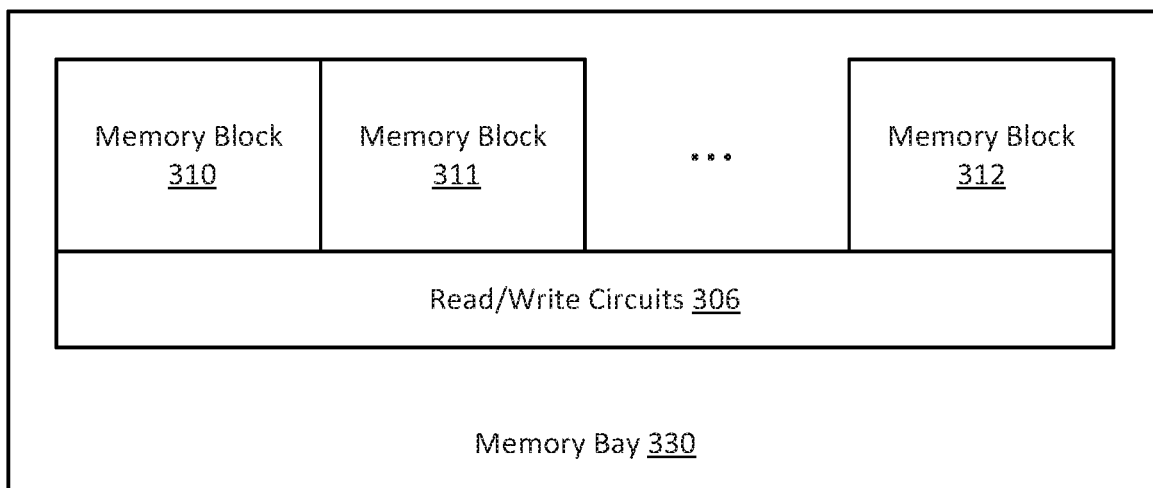

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V). The reading and writing of phase change memory is described further below.

In some cases, read/write circuits 306 may be used to program a particular memory cell to be in one of three or more data/resistance states (i.e., the particular memory cell may comprise a multi-state memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/ resistance states or apply the first voltage difference across the particular memory cell for a second time period less than the first time period (e.g., 50 ns). One or more programming pulses followed by a memory cell verification phase may be used to program the particular memory cell to be in the correct state. In other embodiments, pulses of different current levels can be used, were the read/write circuits 306 used pulses of different current levels to write the memory cells to the different target data states. For phase change memory (PCM) memory embodiments, a memory cell can be moved from the lower resistivity crystalline state to states of increasing levels of amorphous state by applying current pulses of higher current levels or durations to raise portions of the PCM material above the melt temperature. The PCM memory cells can be moved to a more crystalline state by the read/write circuits 306 by applying current pulses sufficient to raise the PCM material above its crystallization temperature, but below its melt temperature.

Figure 1E:
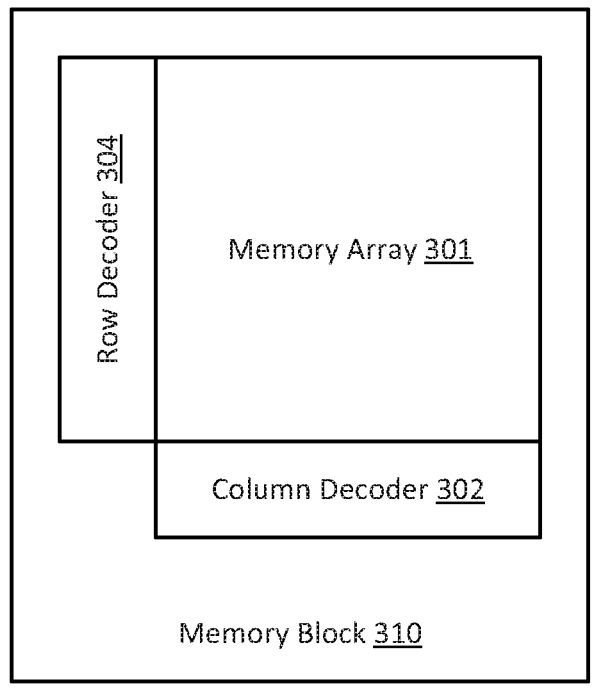

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
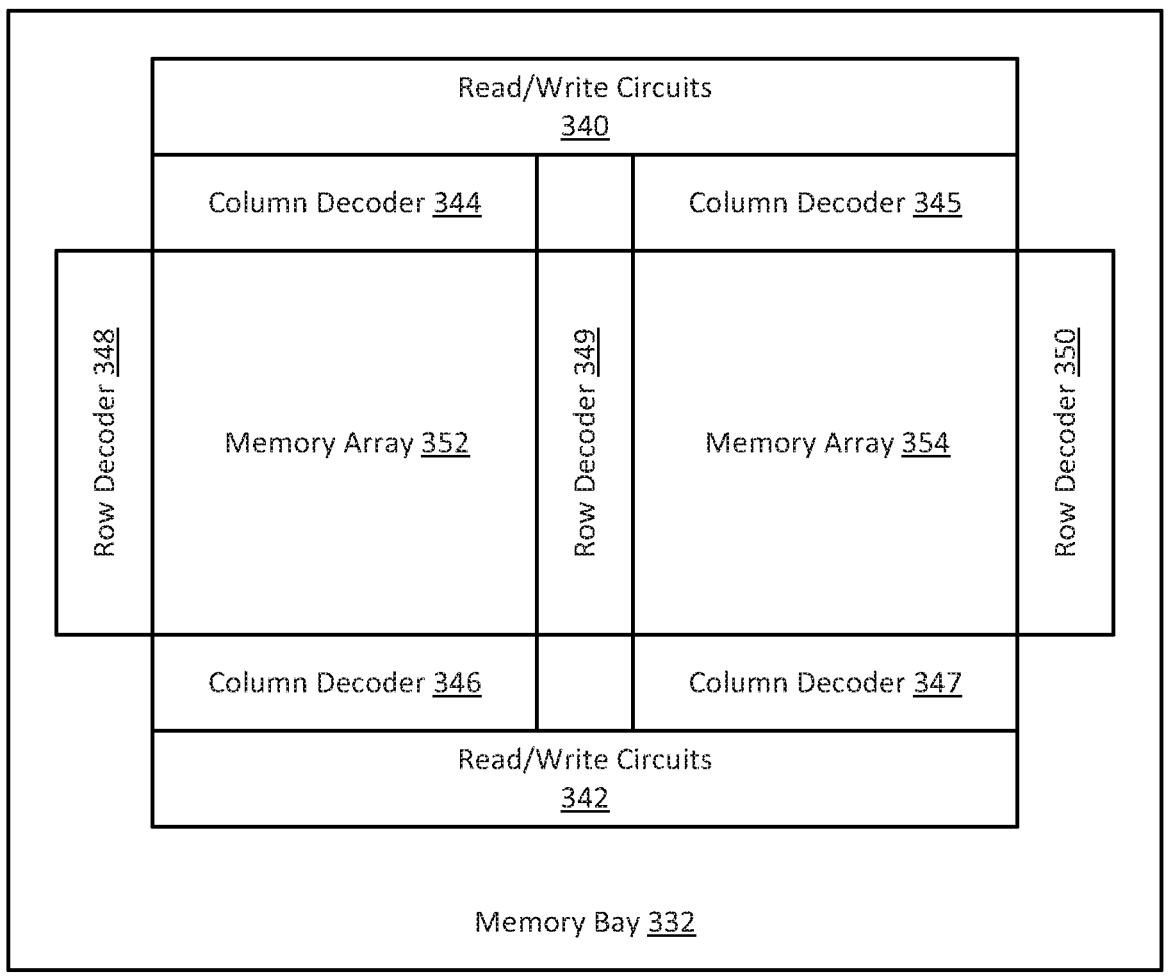

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2:
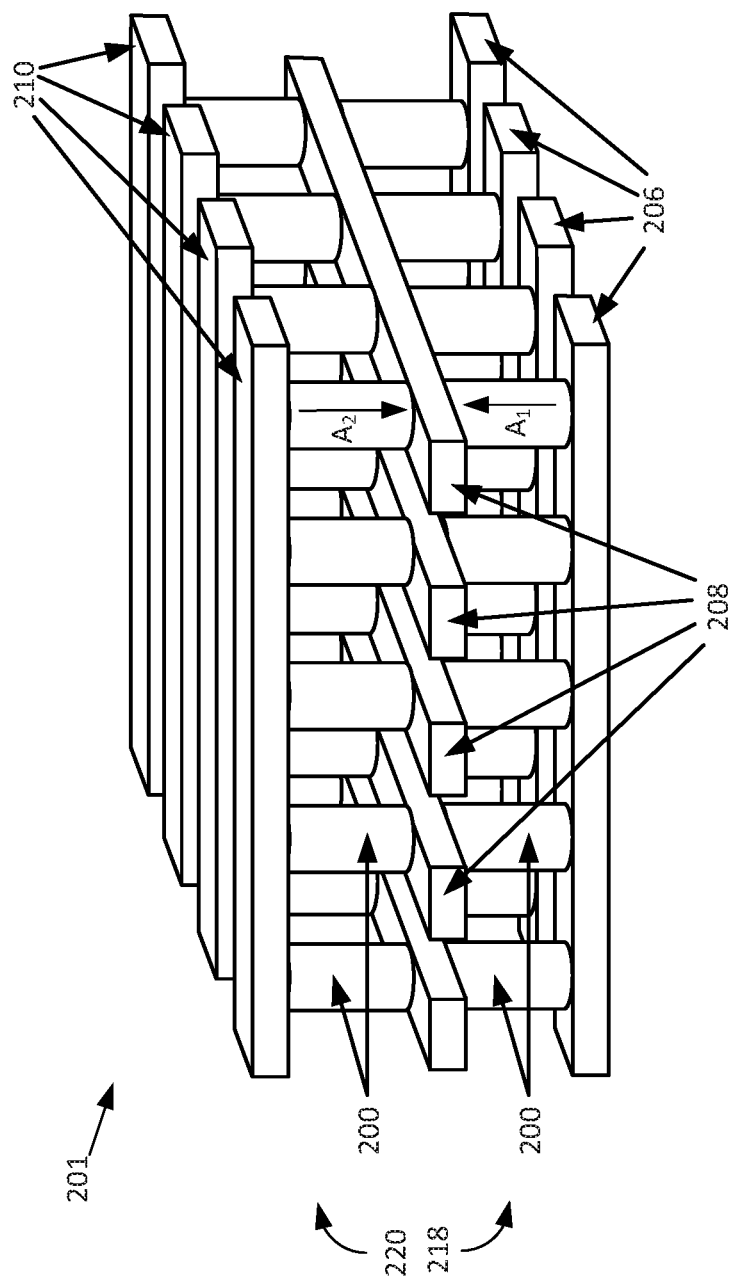
FIGS. 2-3 depict various embodiments of a portion of a three-dimensional memory array.

FIG. 2 depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. FIG. 2 is an example of a horizontal cross-point structure in which word lines 208 and bit lines 206 and 210 both run in a horizontal direction relative to the substrate, while the memory cells 200 are oriented so that the current runs in the vertical direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a select switch or steering element (e.g., an ovonic threshold switch or a diode) and a memory element (i.e., a phase change memory element). In one example, the current in the memory cells of the first memory level 218 may flow upward as indicated by arrow $A_1$, while the current flowing in memory cells of the second memory level 220 may flow downward as indicated by arrow $A_2$, or vice versa. In another embodiment, each memory cell includes a state change element and does not include a select switch element. The absence of a select switch (or other steering element) from a memory cell may reduce the process complexity and costs associated with manufacturing a memory array.

In one embodiment, the memory cells 200 of FIG. 2 may comprise re-writable non-volatile memory cells, including a reversible resistance-switching element such as the phase change memory (PCM) embodiments described in more detail below. A reversible resistance-switching element may include a reversible resistivity-switching material having a resistivity that may be reversibly switched between two or more states.

Referring to FIG. 2, in one embodiment of a read operation, such as could be used when a memory cell is a PCM material in series with polarity asymmetric element (e.g., a diode), the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, such as could be used when a memory cell is a PCM material in series with an ovonic threshold switch (as discussed further below), both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and (in an off-current cancelation scheme) a read circuit may then sense an auto zero amount of current through the selected memory bit line which is subtracted from the bit line current in a second current sensing when the selected word line voltage is applied to the selected word line. Embodiments for the reading of multi-state data in phase change memory are described in more detail below with respect to FIGS. 10A-10C.

Referring to FIG. 2, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level or multi-state memory cell). In some cases, a write operation may be similar to a read operation except with a larger voltage range placed across the selected memory cells. Embodiments for the writing of multi-state data in phase change memory is described in more detail below with respect to FIGS. 9A-9E.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3:
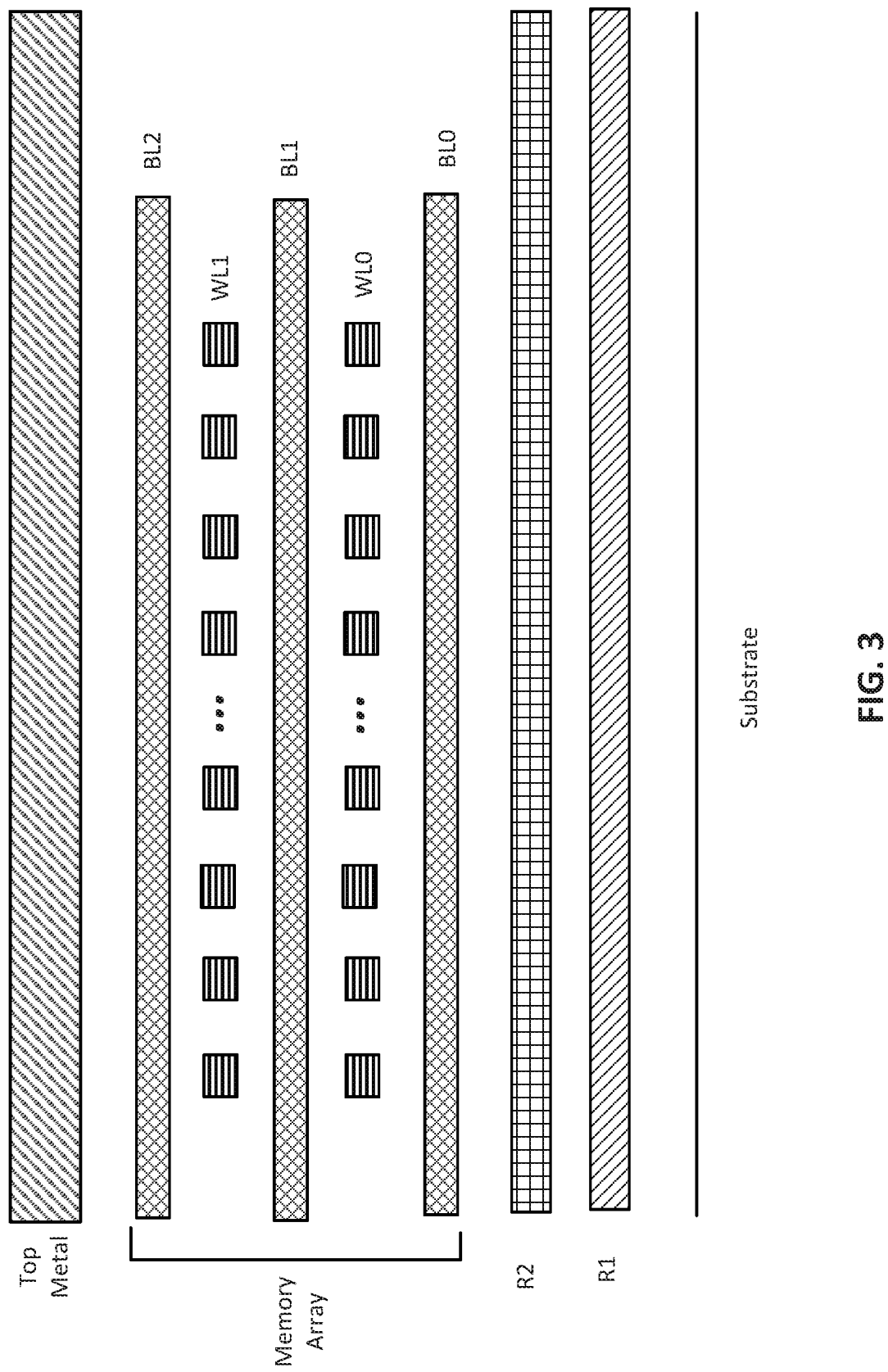

FIG. 3 depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 4:
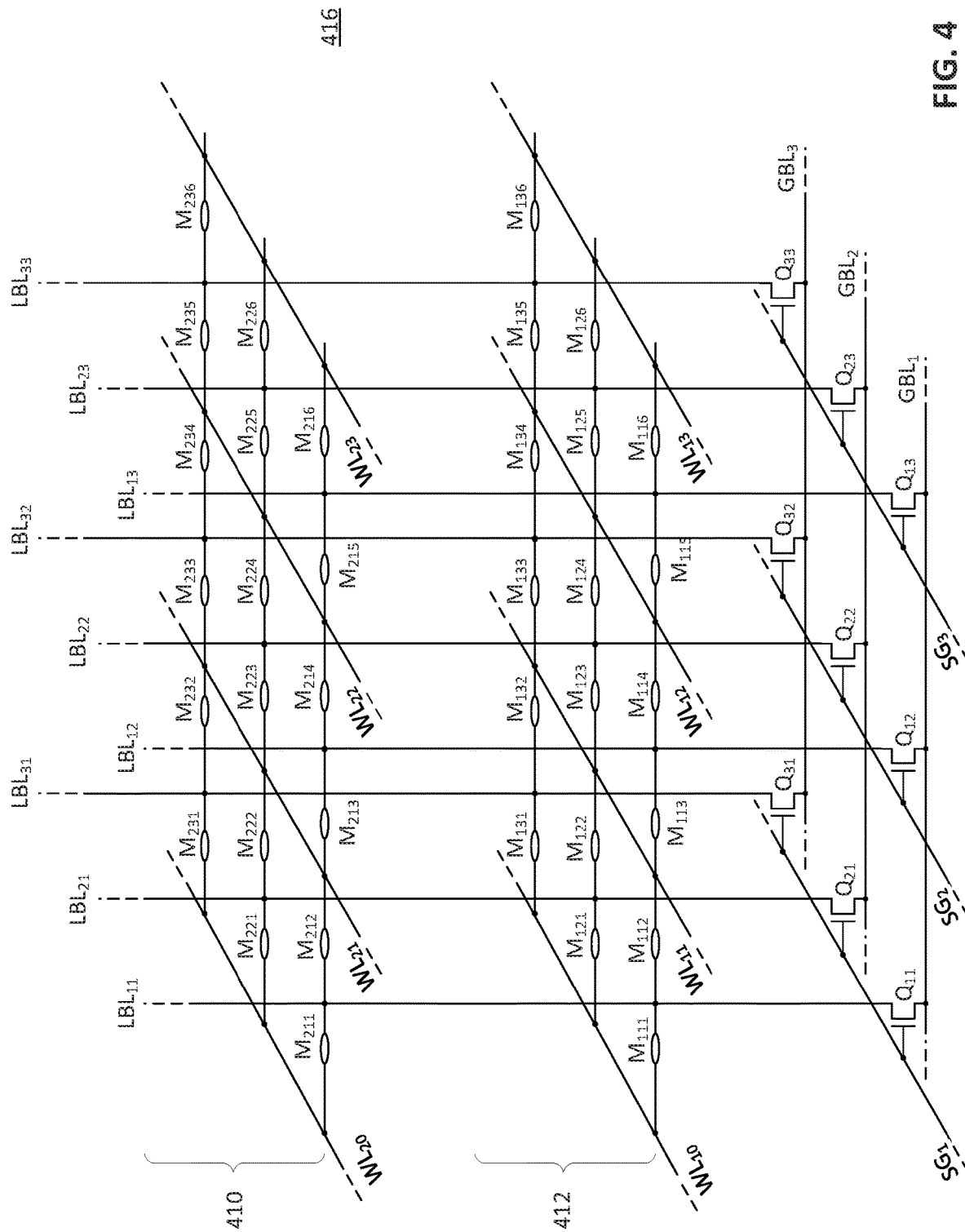
FIG. 4 depicts various embodiments of a portion of a three-dimensional memory array with a vertical cross-point structure.

FIGS. 2 and 3 illustrate a horizontal cross-point architecture, where bit lines and word lines run horizontally with respect to the substrate. Although the memory cell structure described below, where a PCM material is confined within a pocket, or pore, structure lined with a surfactant can be used in a horizontal cross-point arrangement, most of the following discussion is in the context of vertical cross-point structure. In a three-dimensional vertical cross-point structure, the word lines still run horizontally, but the bit lines are now oriented to run in a vertical direction. FIG. 4 illustrates a vertical cross-point structure.

FIG. 4 depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory material, or a ReRAM material. The discussion in the following focusses on the use of a PCM material. The global bit lines $GBL_1$-$GBL_3$ are arranged in a third direction that is perpendicular to both the first direction and the second direction. A set of bit line select devices (e.g., $Q_{11}$-$Q_{31}$), such as a vertical thin film transistor (VTFT), may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$. In the examples discussed below with respect to FIG. 7A, the select devices $Q_{11}$-$Q_{33}$ are implemented as vertical thin film transistors, but other embodiments can be used.

Referring to FIG. 4, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 5:
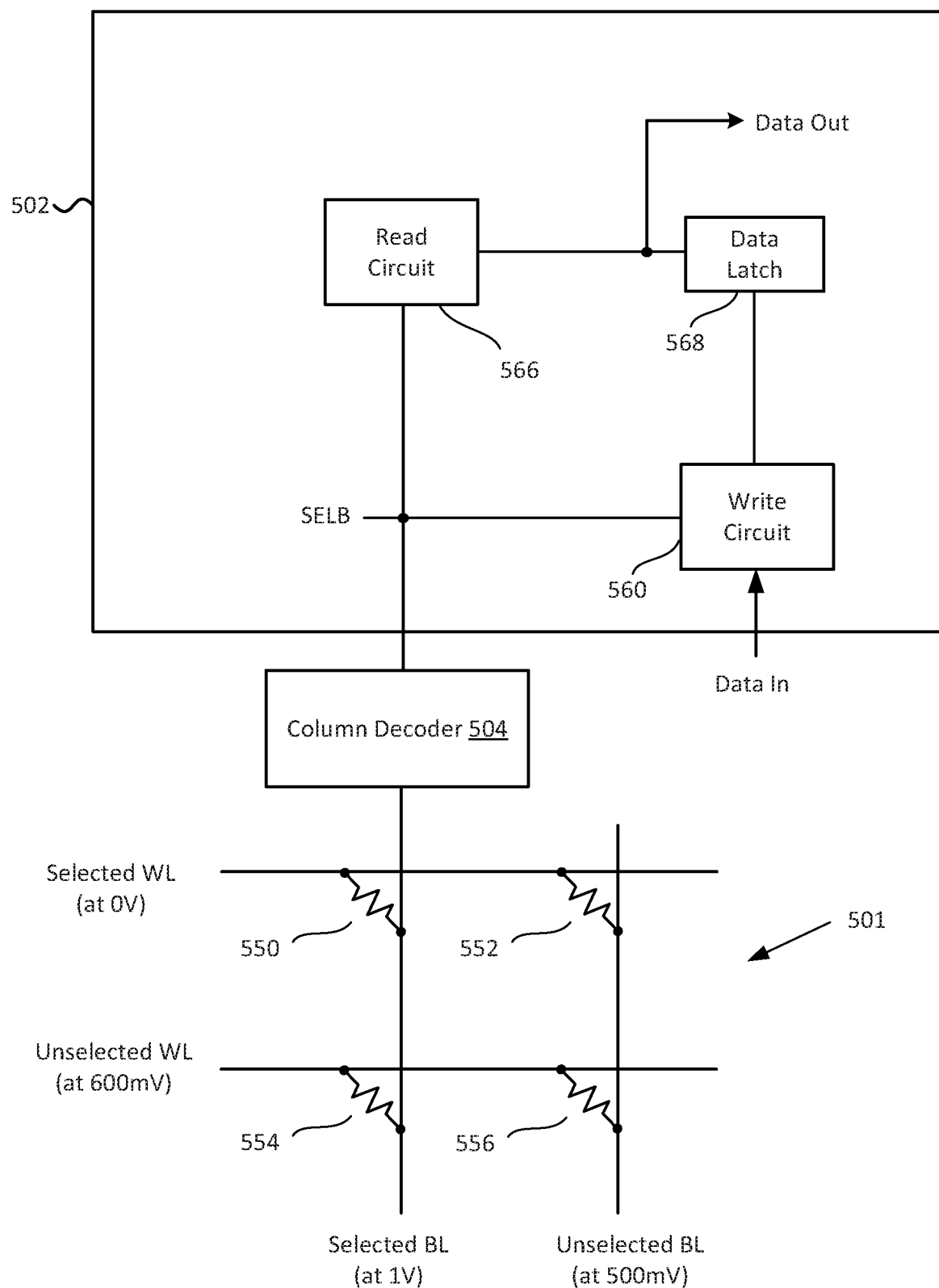
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2. In another embodiment, the portion of a memory array 501 may comprise a memory array with bit lines arranged in a vertical direction that is perpendicular to the substrate, such as memory array 416 in FIG. 4.

The memory array 501 may include a plurality of phase change memory cells. In one embodiment, each of the memory cells within the memory array 501 may include a PCM material in series with an ovonic threshold switch, where the ovonic threshold switch would be located between the PCM material and either the bit line or word line. In one embodiment, the PCM material may comprise a chalcogenide mated al like $Ge_2Sb_2Te_5$ (GST).

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. The write circuit 560 and the read circuit 566 couples (or electrically connects) to the column decoder 504 through the node SELB for sensing the data stored in a coupled memory cell. The output of the read circuit 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. If the current through the selected memory cell 550 is greater than the read current limit, Iref, then, over time, the SELB node will fall below Vref-read (e.g., set to 1.5V) and the read circuit 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the read circuit 566 will read out a data "1." Outputting a data "1" represents that the selected memory cell 550 is in a high resistance state (e.g., a RESET state). Data latch 568 may latch the output of read circuit 566 after a time period of sensing the current through the selected memory cell (e.g., after 400 ns). More detail on an embodiment for the read circuit 566 and its operation for a multi-state phase change memory is given below with respect to FIGS. 10A-10C, after the discussion of the memory cell structure.

In one embodiment, during a write operation, if the Data In terminal requests a data "0" to be written to a selected memory cell, then read/write circuit 502 may bias SELB to the selected bit line voltage for programming a data "0" in write mode via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" or other non "0" value to be written, then read/write circuit 502 may bias SELB to the selected bit line according via write circuit 560. In some cases, if a selected memory cell is to maintain its current state, then the write circuit 560 may bias SELB to a program inhibit voltage during write mode. The program inhibit voltage may be the same as or close to the unselected bit line voltage. In the following, the erased state is taken as the SET, or the low resistance crystalline state, with other states being RESET or partially RESET, corresponding the various degrees of the PCM material being in the amorphous state. More detail on an embodiment for the write circuit 560 and its operation for a multi-state phase change memory is given below with respect to FIGS. 9A-9E, where memory cells are written from the crystalline SET state to the different target states by applying current pulses of different amplitudes that raise the PCM material (or a portion of it) above the melt temperature. An erase operation to take a memory cell back to the SET crystalline state is effected by performing a write operation where the current pulse is sufficient to heat the PCM material above its crystallization temperature, but not above its melt temperature.

One way to increase memory density is through the stacking of multiple memory layers, as illustrated above for horizontal cross-point, as in FIGS. 2 and 3 where both of the bit lines and word lines run in a horizontal direction, or for a vertical cross-point structure, as in FIG. 4 where the word lines run in horizontal direction and the bit line run in a vertical direction. A complimentary method for increasing memory density is through use of multi-state, or multi-level, memory cells (MLCs), where each cell stores more than one bit of data. The following considers a memory structure that combines multiple memory layers in a vertical cross-point structure with multi-state memory cell capability for a phase change memory.

A memory cell formed from a phase change memory material, such as a chalcogenide material like $Ge_2Sb_2Te_5$ (GST), may change phases between an amorphous state (e.g., corresponding with a high resistance reset state) and a crystalline state (e.g., corresponding with a low resistance set state) or between a less-ordered crystalline state and a more-ordered crystalline state. Based upon the portion of a memory cell that is an amorphous state relative to the crystalline state, a phase change memory cell can be considered an "analog" device that can be programmed into one of a multitude of states for MLC operation. By appropriate modulation of programming current/voltage, this can result in a continuous modulation of PCM resistive states, allowing PCM to be used as multi-state cells. To accurately store multi-state data, however, the programmed states of the cells need to be, and remain, stable, so that the resistive state of a cell does not exhibit an excessive amount of drift/change over time or operating conditions (such as temperature).

FIGS. 6A-C illustrate a PCM memory cell with multiple resistance levels. In each of FIGS. 6A-C, a phase change memory material 603 is connected between a word line electrode 601 and a bit line electrode 605. (The layer S 607 is discussed below.) In FIG. 6A, all of the PCM material is in the crystalline, lower resistivity (or SET) state, as indicated by the letter "C". In FIG. 6B, a higher resistivity amorphous (or RESET) region marked by the letter "A" is formed in the memory cell's central region, with a larger amorphous region "A" illustrated in the memory cell of FIG. 6C.

The resistance of the different memory cell states is modelled by the corresponding circuit diagram above each memory cell representation (FIGS. 6A-6C), with the lower resistance C regions represented by the lighter line weight resistors (non-bolded) and the higher resistance A regions represented by the heavier line weight resistors (bolded). Ignoring for a moment the resistances marked "S", by having an increasing portion the PCM material in an amorphous state, the memory cells of FIGS. 6A, 6B and 6C will have increasing resistance levels. (Although not shown in FIGS. 6A-6C, the parallel current paths of the PCM material 603 and the surfactant 607 can connected in series with selector, such as an ovonic threshold switch, as discussed below.) Each of the resistance levels corresponds to a different data state. More data states can similarly be introduced by a finer control of the amorphous to crystalline proportions of the memory cell.

The layer S 607 in parallel with the phase change memory material 603 between the word line electrode 601 and the bit line electrode 605 represents a surfactant, such as a metal-nitride layer, that can be introduced to increase the adhesion of the PCM material to the other layers and suppress drift the memory cell states. To maintain data integrity, the data states stored on a memory cell should be relatively stable over time and varying operating conditions, such as temperature. The surfactant layer can provide this stability such that more states to be accurately stored in a PCM memory cell. The surfactant layer 607 is arranged, or configured, to have a resistivity intermediate to the crystalline state and the amorphous state of the PMC material, as represent by the parallel chain of resistances labelled "S" of an intermediate line weight.

In one embodiment, the surfactant layer 607 has a resistance greater than the crystalline state of the PMC material and less than the amorphous state of the PMC material. The primary read path for current in each of FIGS. 6A-C is represented by the arrows, corresponding to three different resistance states. The resistivity of the amorphous region can drift over time and operating conditions, so that if the current path between the word line and bit line runs through amorphous region, this can make the accurate storage of multi-state data difficult in the memory cell. The crystalline phase of the PCM material and the surfactant both have relatively stable resistivities. By having a surfactant layer with a resistance intermediate to that of the crystalline and amorphous phase regions of the PCM material adjacent to and in contact with the PCM material, this provides a second current path between the word line and bit line. This allows for the current between the word line and bit line to bypass the relatively unstable amorphous region, but still increase the resistance level by increasing the proportion of the PCM material in the amorphous state. The use of a surfactant with the phase change memory cell can improve multi-state operation of such memory cells, whether in a horizontal cross-point memory structure, as in FIGS. 2 and 3, in a vertical cross-point structure, as in FIG. 4, or in other structures using such memory cells.

More specifically, the incorporation of a multi-state PCM memory cell within a vertical cross point architecture can provide a high-density memory structure. The use of the surfactant, such as a metal-nitride, in a recessed word line structure for GST or other PCM material, can aid with adhesion and drift suppression. FIG. 7A illustrates such a structure, according to one embodiment.

Figure 7B:
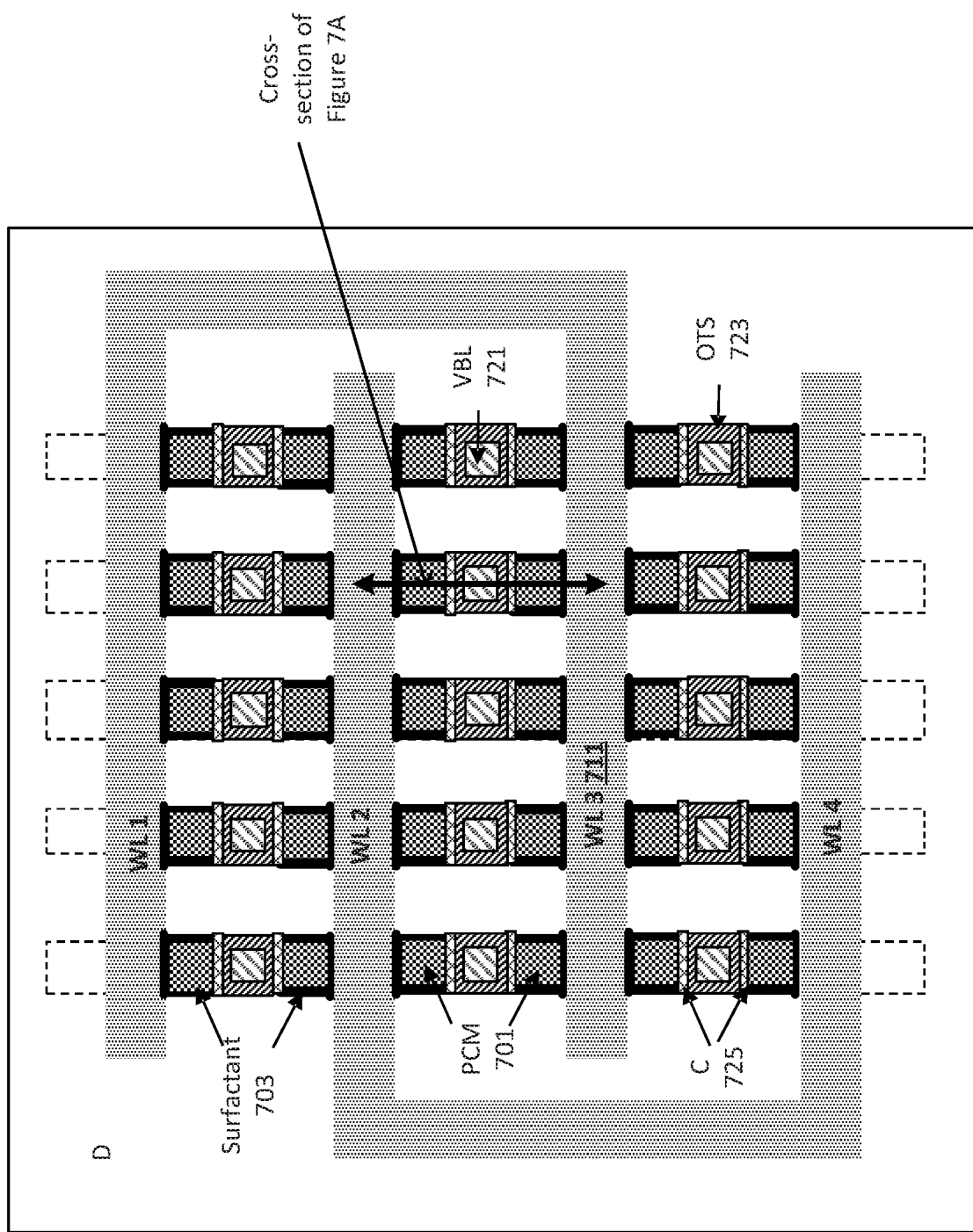
FIG. 7B is top view of one embodiment of a vertical cross-point memory structure with recessed PCM memory cells.

FIG. 7A shows cross-sectional side view one embodiment of a vertical cross-point memory structure with recessed PCM memory cells taken from the line indicated in FIG. 7B. FIG. 7A illustrates a side view of a portion of a vertical cross-point array such as described above with respect to FIG. 4, illustrating a single local vertical bit line 721, such as $LBL_{11}$ in FIG. 4, and the word lines (such as 711) to either side. Relative to the embodiments described in FIG. 4, the phase change memory material (PCM 701) of the non-volatile memory cell in the embodiment of FIG. 7A is confined in a pore-like recessed pocket region of the word lines, as described below. The array using such a vertical cross-point structure with the confined, recessed PCM material can then be incorporated in a memory device as illustrated with respect to FIGS. 1A-1F In the embodiment illustrated in FIG. 7A, under a top dielectric layer 712 a series of word lines WL (e.g. 711) alternate with dielectric layers D (e.g. 713). The example of FIG. 7A shows four word line layers, but other embodiments can use a different number of word lines. A local vertical bit line VBL 721 is connected to a global bit line GBL 733 through a select switch 731, in this example a vertical thin film transistor VTFT, but other switches can be used. The VTFT includes a central P− region, with N+ regions above and below and a control gate to the sides. The lower dielectric layer 714 and global bit lines such as GBL 733 are formed over a substrate (not shown). In some embodiments, the region under the lower dielectric layer and global bits lines can includes CMOS or other circuit elements (decoders, drivers, and so on) for operation of the array. The vertical bit line VBL 721 is formed in the trench or memory hole structure between the word line layers. In the example of FIG. 7A, the word lines on either side of the bit line are separate, but in other embodiments, the word lines on either side may be connected and surround VBL 721 on one or both sides.

Each word line WL is recessed from the vertical bit line VBL 721 relative the inter-word line dielectric layers D, forming a set of recessed pockets within which the phase change memory material PCM 701 is located. The thickness of the vertical dimension of the recessed pocket is based on the word line thickness and can be, for example, on the order of 5 nm or somewhat larger, while the width (the distance that it extends toward the vertical bit line) of the recessed pocket may be, for example, 10 nm or more. In the example, the memory cells to the left and to the right of VBL 721 are distinct, but in other embodiments can be portions of a common memory cell surrounding the VBL 721 to the front, behind or both sides. The example of FIG. 7A also includes a surfactant layer (such as 703), such as a metal-nitride, lining the recessed pocket within which the GST or other PCM 701 is located, where the surfactant can aid with adhesion and drift suppression to improve multi-state operation as described with respect to FIGS. 6A-6C. In the embodiment of FIG. 7A, in addition to being around (to the sides, above and below) the PCM material 701 to provide a parallel current path between the word lines and the bit lines, the surfactant 703 is also in a thin layer between the PCM material 701 and the word line 711. Although not needed for providing the parallel current path, this is a result in some embodiments of forming the surfactant lining of the pocket or pore structure within which the PCM material will later be formed. Alternate embodiments can omit the surfactant between the word line layers WL and the PCM material and/or some of the surfactant separating the PCM material from the dielectric, but still provide the surfactant on one or more sides (for example, lining the pocket just along the bottom) to provide the adjacent, parallel current path described with respect to FIG. 6A-6C. Still other embodiments may omit the surfactant, operate the memory cell as a binary device, or implement a combination of both variations.

The phase change memory material PCM 701 of each memory cell is separated from the vertical bit line VBL 721 by selector switch, such as by an ovonic threshold switch layer OTS 723. The ovonic threshold switch layer OTS 723 is made of a material, such as glass of special composition, with the ability to change from an electrically nonconducting state to a semiconducting state upon application of a certain minimum voltage differential. OTS materials are usually amorphous semiconductors covering a wide range of compositions. These can include oxide-, boron- and chalcogenide-based glasses combined with other elements of groups III, IV, V and VI. When a high enough voltage difference is applied between the vertical bit line VBL 721 and the word line WL 711 relative to the resistance state of the PCM material 701, the OTS 723 will act as a conductor providing a current path between the word line WL 711 to the bit line VBL 721. A carbon C 725 or other layer with an electric resistivity higher than the word lines and bit lines layers can be formed between the OTS 723 and PCM 701 if needed to provide separation to avoid intermixing of the material during operation of the memory cell. In other embodiments, the carbon or other diffusion barrier layer may be omitted if the OTS material is stable enough to not intermix with the PCM material during operation.

FIG. 8 is an equivalent circuit diagram representation of the portion of the memory structure illustrated in FIG. 7A. As described with respect to FIGS. 6A-6C, each PCM memory cell is a variable resistance device having a value dependent upon the state to which it is programmed. Each PCM memory cell is connected between a word line WL (such as 711) and a bit line VBL (such as 721). The local bit line VBL 721 is connected to the global bit line 733 through a switch 731, whether a vertical thin film transistor VTFT or other type of switch, controlled by the level of an LBL voltage on the control gate of the VTFT 731. The PCM memory cells are each connected to the bit line VBL 721 through the ovonic threshold switch layer OTS 723 or other selector switch, which acts as a series connected switching element with the PCM memory cell, that will conduct when a sufficient voltage difference is applied across it. Within a larger array structure, this corresponds to a more detailed representation of the memory cells along either side of a vertical bit line, such as $LBL_{11}$ of FIG. 4, where the memory cells of FIG. 4 correspond to the series combination of the phase change memory material PCM in series with the ovonic threshold switch OTS. Other examples of selector switches can include polysilicon PN junctions, oxide PN junctions, oxide rectifiers ($Pt/TiO_2/Ti$), or mixed ion-electron conductor (MIEC), among others.

In FIG. 7A, current can flow into the PCM material 701 through surfactant layer 703 from the corresponding word line 711. If the dielectric layer D between adjacent word lines is sufficiently thick, significant current will not flow from the either the word line above or below a selected memory cell. If the sides (the directions into and out the page) of a memory cell are in contact to the conductive word line layer WL, current may flow in to the memory cells from the sides, making multi-state operation more challenging. The can be explained further by reference to FIGS. 7B-7D.

FIG. 7B is top view of one embodiment of a vertical cross-point memory structure with PCM memory cells confined within a recess. In this FIG. 7B, the view is looking down at a word line layer on a number of vertical bit line structures with distinct PCM memory cells above and below (as represented in FIG. 7B) each vertical bit line (VBL). A cross-sectional cut that corresponds to FIG. 7A is indicated for one of the vertical bit line structures. In this embodiment, word lines WL1, WL2, WL3, WL4 run horizontally and are connected by vertical sections to form two U shapes. For each vertical bit line, a memory cell is connected to a word line on either side of the vertical bit line. The embodiment of FIG. 7B again includes the surfactant and the carbon layer C.

Figure 7C:
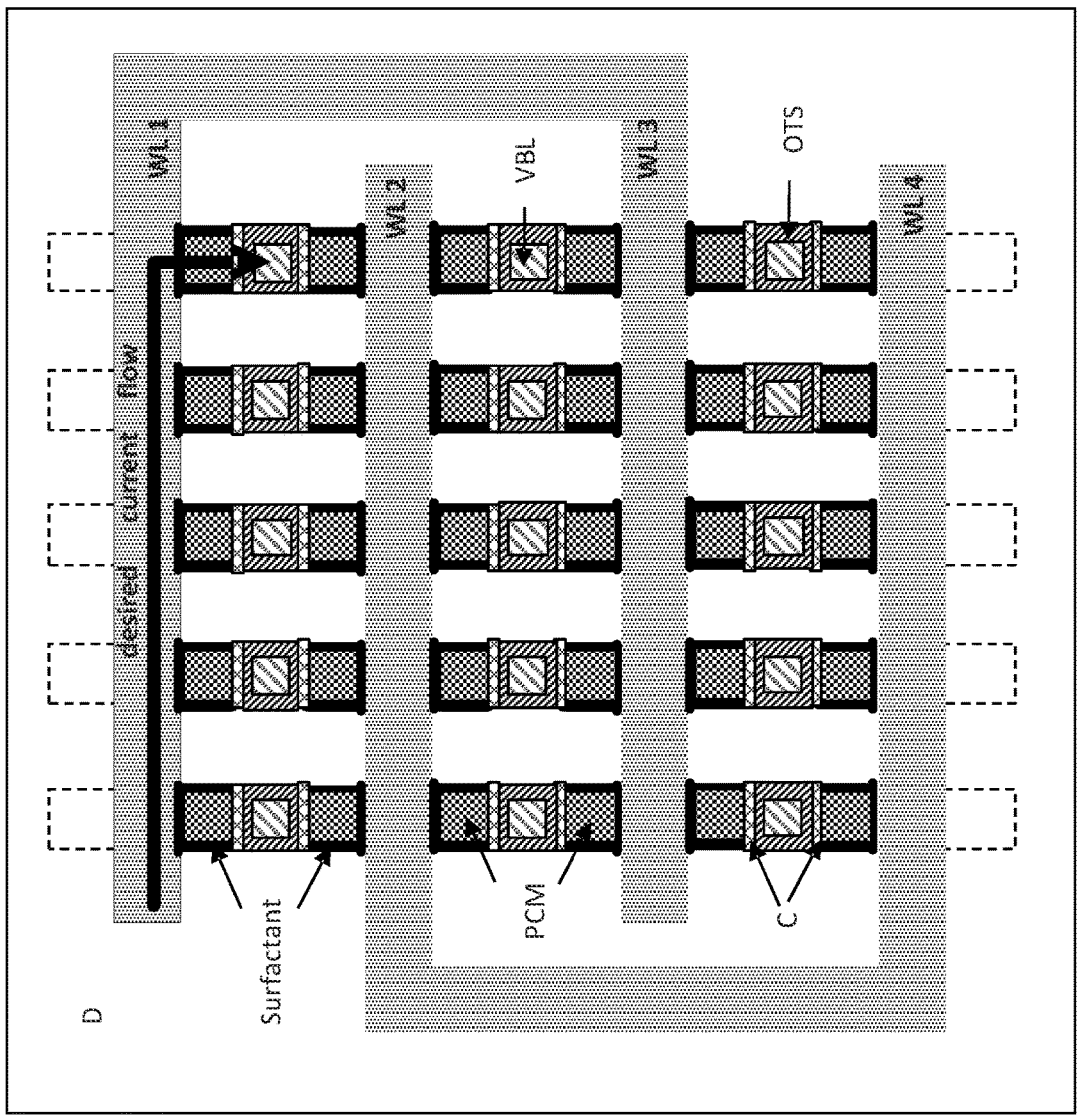
FIGS. 7C and 7D illustrate current flow from a word line into a memory cell for the "crested" structure of FIG. 7B and a non-"crested" word line structure, respectively.

In FIG. 7B each of the memory cells is located in a pocket, formed by removing a prong extending from a word line towards bit line. For example, the PCM material 701 is formed with the pocket lined with the surfactant 703. The area to the sides of memory cells, separating the PCM material of one memory cell for an adjacent memory cell to either side along the same word line is filled with dielectric D of layer 713. The dielectric causes the current flowing from the word line 711 to the memory cell to enter from the "back" of a cell, where this desired current flow is illustrated in FIG. 7C.

Figure 7D:
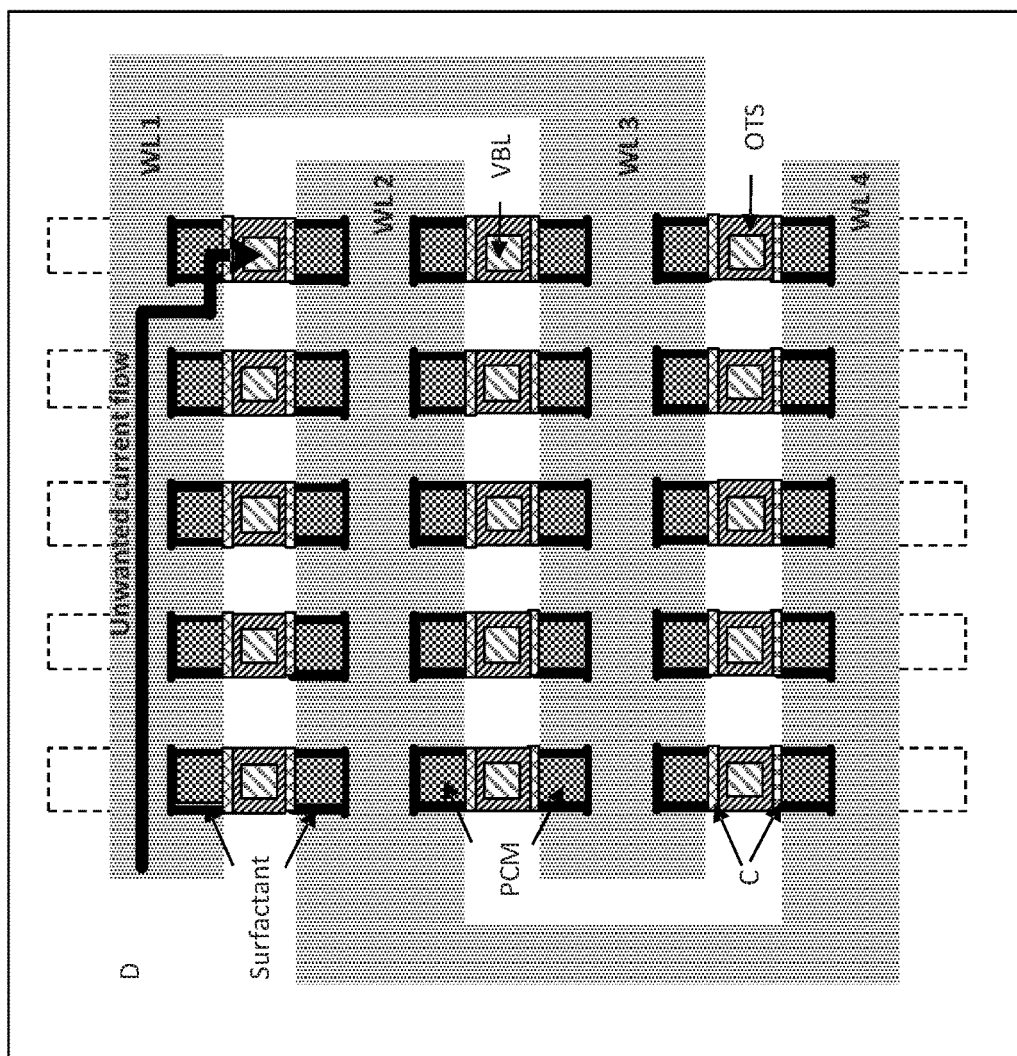

In an alternate set of embodiments, the pocket for a memory cell can be recessed into the word line, as illustrated FIG. 7D. The embodiment of FIG. 7D can be used to store a single bit per cell. However, such an architecture is less desirable for storing multiple bits per cell. As illustrated in FIG. 7D, in this arrangement, current can also enter the memory cell from the sides. For multi-state/multi-bit per cell operation, this current is typically unwanted current flow as it can make multi-state programming and reading less controllable as the current will concentrate nearer to the bit line. The confined (or "pore" type) memory cell structure of FIG. 7C in which the PCM material is confined by dielectric on all but one side, combined with the surfactant pocket lining make the current levels more controllable, allowing for lower power and multi-state operation. A confined memory cell structure positioned within the pocket, as in FIGS. 7B and 7C provides thermal confinement such that lower programming current can be used to operate the PCM material of the memory cell.

To avoid this unwanted side current, rather forming the memory cells in pockets within the word lines (as in FIG. 7D), the word line layers instead use a "crested", or pronged, structure, where the pockets for the PCM material of the memory cells are formed within the area previously occupied by prongs extending outward from the word lines towards each of the vertical bit line structures. This is the structure illustrated in FIGS. 7B and 7C, where the region between adjacent memory cells is filled with a dielectric material. The PCM material and surrounding surfactant of each memory cell is then formed within one these word line pockets formed within the prongs. Whether the "crested" word line structure with these prongs as in FIGS. 7B and 7C, or in the sort of structure illustrated in FIG. 7D where the memory cells pockets are recessed with word line material to either side, the cross-sectional view of FIG. 7A would be the same.

To write multi-state data to a PCM memory cell, the memory cell can either start in the low resistance crystalline stage as in FIG. 6A and have the relative amount of amorphous region increased as in in FIGS. 6B and 6C, or start in the amorphous state and have the crystalline region increased. In either case, the state of the PCM material can be changed by applying a current pulse, where to move to a more amorphous state the pulse will raise the PCM material above the melt temperature; and to move to a more crystalline state the pulse will raise the PCM material above the crystallization temperature, but not above the melt temperature. In the embodiments discussed below, the erased state will be taken as the low resistance crystalline state and the higher programmed states will be taken as have increasing levels of the higher resistance from a larger amorphous region, but in other embodiments these could be reversed. FIGS. 9A-9E illustrate an embodiment for a write circuitry and its operation, which can also be used in an erase operation as in either case a current pulse is used to change the state of at least a portion of the PCM material.

Figure 9A:
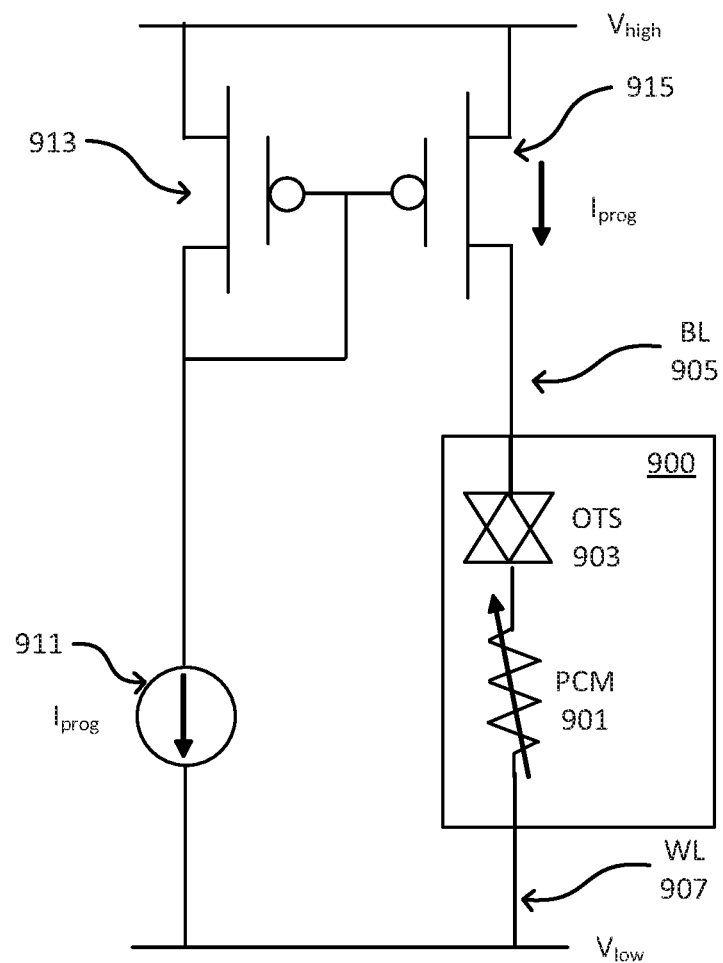
FIG. 9A shows one embodiment for write circuitry.

FIG. 9A shows one embodiment for write circuitry such as can be incorporated in the write circuit 560 of FIG. 5 for the PCM memory structure described with respect to FIGS. 1A-8. FIG. 9A shows a portion of the write circuitry connected to a single selected memory cell 900. Decoding and select circuitry, such as column decoder 504 in FIG. 5, and other elements are omitted in FIG. 9A to simplify the discussion. The write circuit 560 of FIG. 5 would typically have multiple copies of the write circuitry elements illustrated in FIG. 9A connected through decoding circuitry to be able to concurrently program multiple memory cells.

The selected memory cell 900 in this embodiment includes a phase change memory material PCM 901 connected in series with an ovonic threshold switch OTS 903 between a bit line BL 905 and word line WL 907. The state of the PCM material 901 is changed by applying a current $I_{prog}$ through the cell 901. In the shown embodiment, the word line 907 is placed at a low voltage level, such as ground, and the programming current $I_{prog}$ is applied from the bit line BL 905. The programming current $I_{prog}$ is provided by the transistor 915 that is connected between the bit line BL905 and a high voltage level, where this can be a regulated supply level on the memory circuity or a raised level such as can be generated by a charge pump.

The transistor 915 is part of current mirror, mirroring the current through transistor 913, which is connected between the high and low voltage levels in series with a current source 911 providing $I_{prog}$. In this embodiment, the transistors 913 and 915 are here implemented as PMOS devices, but other embodiments can use N type devices. In a symmetric current mirror, where transistors are of the same width/length, $I_{prog}$ will be the same as $I_{prog}$, but different ratios can be obtained by varying the relative device sizes. Different values for $I_{prog}$ can be obtained by varying $I_{prog}$, by having multiple transistors connected similarly to 915 of varying dimensions mirroring the $I_{prog}$ value by differing ratios, or some combination of these. Additional selected memory cells can simultaneously be written by repeating the current mirror arrangement, mirroring the current in multiple transistors, or some combination of these.

In an embodiment where the memory cells are written by starting with the PCM material in a crystalline state (as in FIG. 6A) and increasing the amount of the amorphous region (as in FIGS. 6B and 6C), different programmed states can be achieved by using different $I_{prog}$ levels. This illustrated in FIG. 9B.

Figure 9B:
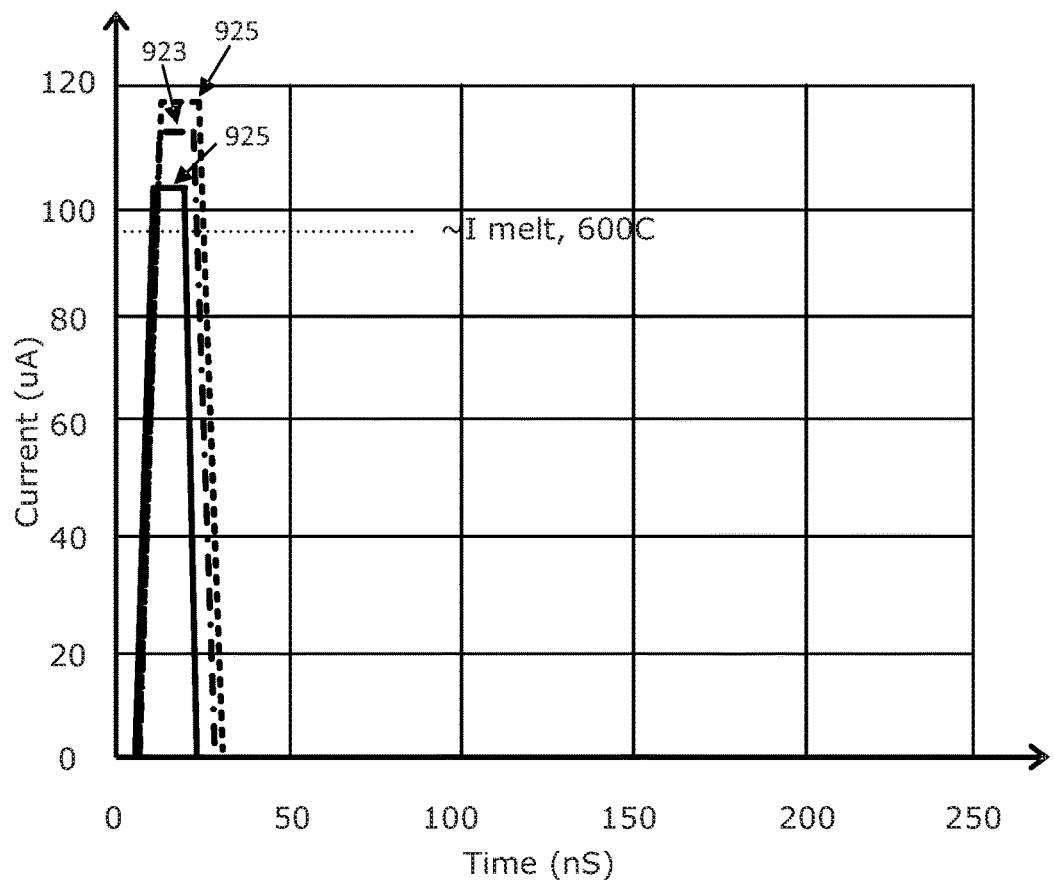
FIG. 9B illustrates examples of current pulses for multi-state programming of a PCM memory cell.

FIG. 9B illustrates several write pulses for the programming current $I_{prog}$ that can be used in one embodiment to program a PCM memory cell in a reset, or partial reset, operation. Starting initially with the PCM in a crystalline state, three pulse amplitude are shown, corresponding to three different levels of programming (increased amorphous region) from the crystalline state. The current increases the temperature in the memory cell, melting the PCM's crystal region. The melt current scales with memory cell size, with, for example, a current of around 100 μA for a 20 nm memory cell. The program current can exceed the corresponding melt current, while staying within a level that maintains cell integrity and keeps adjacent memory cells within their thermal disturb limits. FIG. 9B shows three different current levels 931, 933 and 935, which will respectively melt increasingly larger regions of the PCM crystalline region. A few nanoseconds or tens of nanoseconds above the melt temperature can be sufficient to melt the PCM material without degrading cell integrity or disturbing adjacent memory cells. A rapid termination (a few nanoseconds) of the current pulse drops the temperature, locking in the solid amorphous PCM structure. For example, the pulses 921 and 923 could correspond to the respective states shown in FIGS. 6B and 6C, with pulse 925 corresponding to an even larger amorphous region.

Figure 9D:
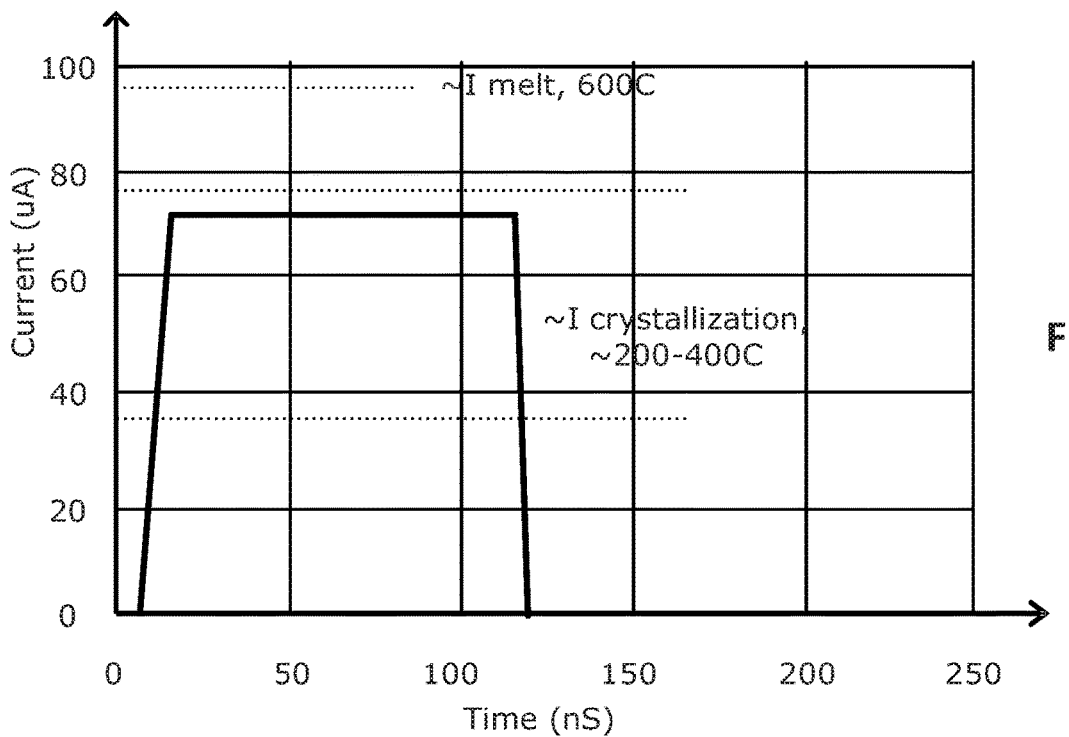
FIG. 9D illustrates an embodiment for a current pulse to set the memory cells' PCM to the crystalline phase.
Figures 9C, 9E:
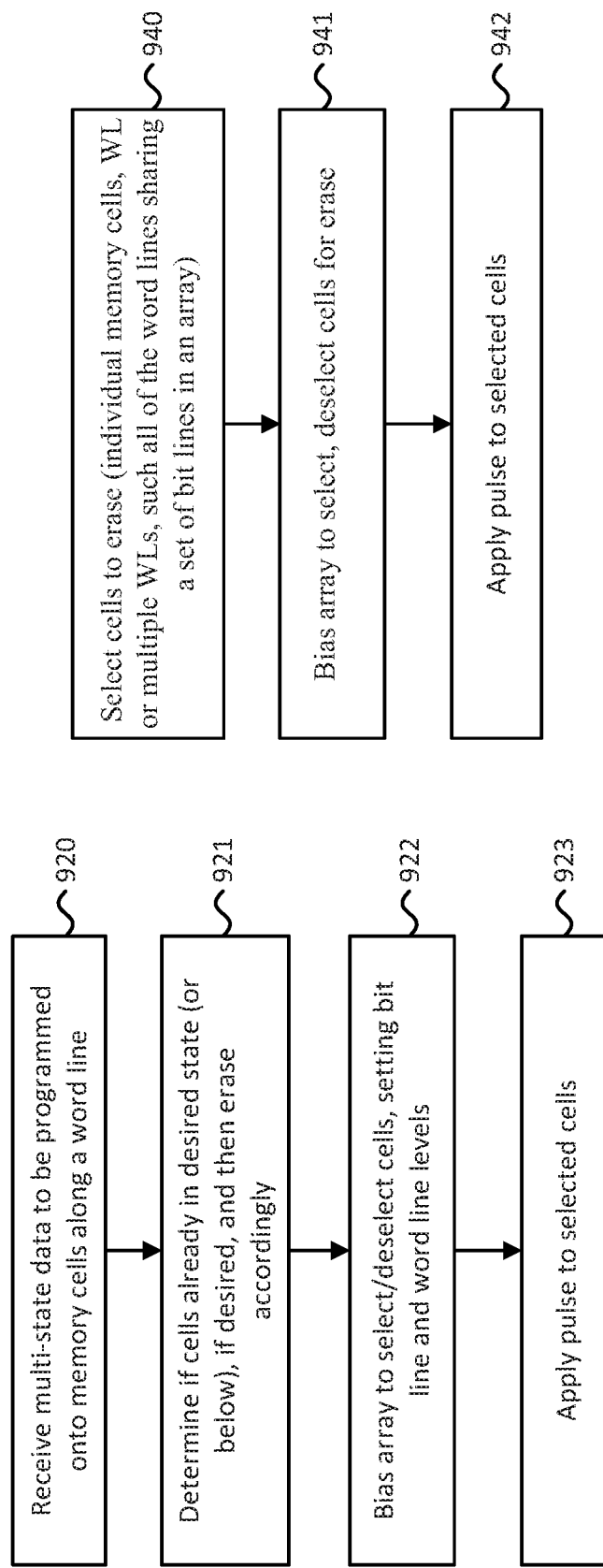
FIG. 9C is a flowchart describing an embodiment for writing an array of PCM based memory cells.
FIG. 9E is a flowchart describing an embodiment for erasing an array of phase change memory material based memory cells in which the memory cells are set to a crystalline state.

Depending on the embodiment, data programming to different states can use current of differing amplitudes (as in FIG. 9B), differing durations, or a combination of these. A single-pulse algorithm can be used, or multiple pulses, which may also include a verification between some or all of the pulses. Additionally, as the memory structure allows for the memory cells to be set and reset individually, if a memory cell is already in the target state (or in a lower state), it need not be erased beforehand to the crystalline state but left in its current state or programmed without being first set to the crystalline state. FIG. 9C is a flow for one embodiment of a program operation.

FIG. 9C depicts a flowchart describing an example of an embodiment of processes for writing an array of phase change memory cells in which the memory cells are written from a crystalline state into states having varying degrees of the amorphous state PCM material. At step 920 the memory device receives form the controller the multi-state data to be programmed into memory cells along a word line. Depending on the embodiment, the memory cells along the selected word line may or may had have previously been erased (here, to the crystalline state of the PCM material). As the structure described here allows for the memory cells to be individually set and reset a number of variations are available, depending on the embodiment. In one set of embodiments, all of the memory cells along a word line can be, or previously will have been, erased. Alternately, the memory cells can selectively be erased, as described with respect to step 921.

In some embodiments, if the memory cells along the word line have not already been erased, a step 921 can be included to determine if any of the memory cells are in the desired state, or in a lower state, and are not to be erased. The cells to be erased can then be erased. As the memory architecture allows for the PCM memory cells to be individually set and reset, in contrast to a flash memory structure where erase is at the block level, in some embodiments only the memory cells needing to be erased can be erased. In other embodiments, the erase can be at word line or other level. The erase process (setting of the PCM material to the crystalline state) is discussed further with respect to FIGS. 9D and 9E.

At step 922, the array is biased to select and deselect the memory cells to be written by setting the word line and bit line levels accordingly. One embodiment for this is illustrated in FIG. 5, where the selected word lines are set to ground, the non-selected word lines and bit lines at an intermediate voltage level, and the program selected bit lines set at a somewhat higher voltage. Under these bias conditions, the voltage across the non-selected memory cells will not be sufficient to cause the ovonic threshold switch to conduct, while the selected memory cells will conduct when a programming current pulse is applied in step 923. The embodiments primarily discussed here bias a selected word line to ground, allowing each selected bit line's pulse to be set separately. Alternate embodiments can apply the current pulses down the selected word lines, but in this case, all of the cells along the selected word line receive a common pulse.

In step 923 the programming pulse or pulses are applied to the selected memory cells. In one set of embodiments, these can be as illustrated in FIG. 9B, where, starting from the erased (crystalline) state, if a memory cell is to stay in the erased state or otherwise deselected, no pulse is applied; and if a memory cell is to be programmed, a current pulse is applied with a state dependent amplitude. Depending on the embodiment, all memory cells along a word line or only a subset of the memory cells along the word line can be programmed concurrently. Additionally, in a multi-state embodiment all states can be programmed concurrently or only a single state or subset can be programmed at a time. Also discussed with respect to FIG. 9B, rather than use a single current pulse whose amplitude depends on the target state, different target states can alternately or additionally vary the pulse duration based on the target state. In still other embodiments, multiple pulse can be used, either with or without a verify/lock-out mechanism. The choice of programming algorithm can be based on the desired level of accuracy required in view of processing and operation parameter variations and the number of states being stored per memory cell.

As noted above, the PCM memory structures described here allow for the memory cells to be individually moved from the crystalline state to the amorphous state or from the amorphous state to the crystalline state. In the discussion of FIGS. 9A-9E, the crystalline state is taken as the erased state and programming to different states increases the size of the amorphous region to varying degrees (FIGS. 9A-9C), while the erase process takes all of the memory cells' PCM material to the crystalline state (FIGS. 9D and 9E, below). In an alternate set of embodiments, the roles can be reversed, where the amorphous state is taken as the erased state and the programming to different states increases the size of the crystalline region to varying degrees. In this alternate set of embodiments, the melting pulse of FIG. 9B would be sufficient to take all selected cells to the amorphous state, while now the crystallization pulses would be modulated to move the PCM material to the crystalline state to varying degrees. In still other embodiments, memory cells could be written in either direction from the cell's current state to its target state. FIGS. 9D and 9E look at the amorphous to crystalline transition pulse, where this corresponds to the erase operation of the main embodiments discussed here.

FIG. 9D illustrates one embodiment for a current pulse to set the memory cells' PCM to the crystalline phase, here taken as the erased state. The circuitry for applying the erase pulse can be the same as described with respect to FIG. 9A, except that the current applied to the cell will now be sufficient to take the PCM material above its crystallization temperature, but not above its melt temperature. In the main embodiments discussed here, as this is being used as an erase operation, the pulse (or cumulative effect of multiple pulse) should be sufficient to take all memory cells to the sort of fully crystalline state illustrated in FIG. 6A.

In the embodiment illustrated in FIG. 9D, a single current pulse is applied to the selected memory cells. The amplitude is sufficient to raise the PCM material above its crystallization temperature, but not high enough to reach the melt temperature. For example, the pulse could be of a duration of around 100-200 ns for a temperature in the 400° C.-200° C. to nucleate or grow the PCM crystal. In this example, a current of around 75 µA is shown. In alternate embodiments, a series of pulses can be used, either with or without use of an erase verify-lockout arrangement. In still other embodiments, rather than a constant amplitude pulse, the bit line can be pre-charged and allowed to discharge so as to hold the PCM material in the crystallization temperature range for a sufficient amount of time.

FIG. 9E depicts a flowchart describing an example of an embodiment of processes for erasing an array of phase change memory material based memory cells in which the memory cells are set to a crystalline state of the PCM. At step 940, the memory determines the memory cells to erase. As the PCM based memory structure described here allows for the memory cells to be set on an individual basis, the erase can be performed at different levels of granularity: at the level of individual cells, all or part of an individual word line, or at the level of multiple word lines, such as all of the word lines spanning a common set of bit lines, where the decision can be a tradeoff between performance and power. Additional, where a word line or other set of memory cells are selected for erase, memory cells already in the erased state may be de-selected to save on power consumption. Depending on the embodiment, the erase operation can variously be performed in response to a specific erase command, or as part of a write command, such as before step 940 or as part of step 941 in the flow of FIG. 9C.

At step 941, the array is biased to select, deselect the memory cells for erase. This can be implemented in much the same way as for step 922 of FIG. 9C, as the difference will be in the subsequent pulse being applied at step 942 having a longer duration, but lower amplitude, than the pulses used in the programming process.

At step 942, the erase pulse, such as illustrated in the FIG. 9D, is applied to the erased selected bit lines by the write circuity of FIG. 9A. As discussed with respect to FIG. 9D, alternate embodiments can use multiple pulses with or without an erase/lock-out mechanism. Other embodiments can apply the erase pulse down selected word lines, rather than bit lines.

Figure 10A:
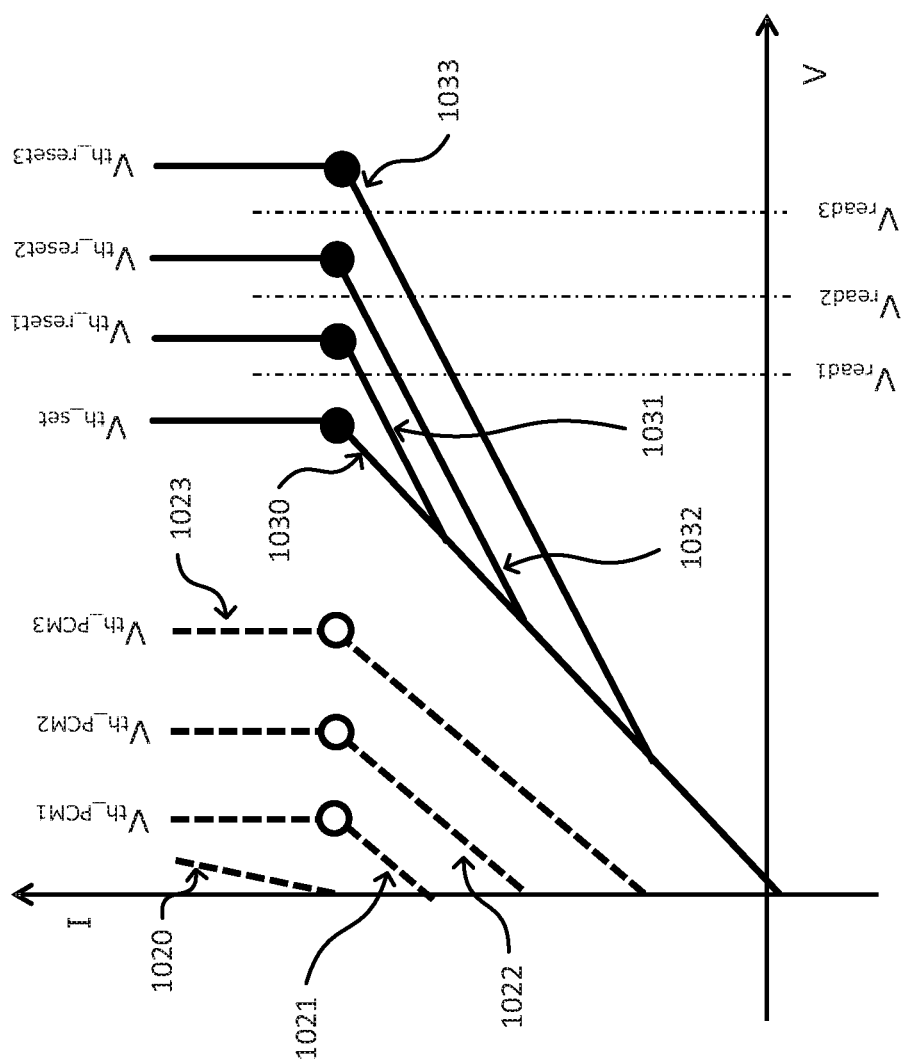
FIG. 10A illustrates the current-voltage characteristics of a PCM based memory cell.
Figure 10B:
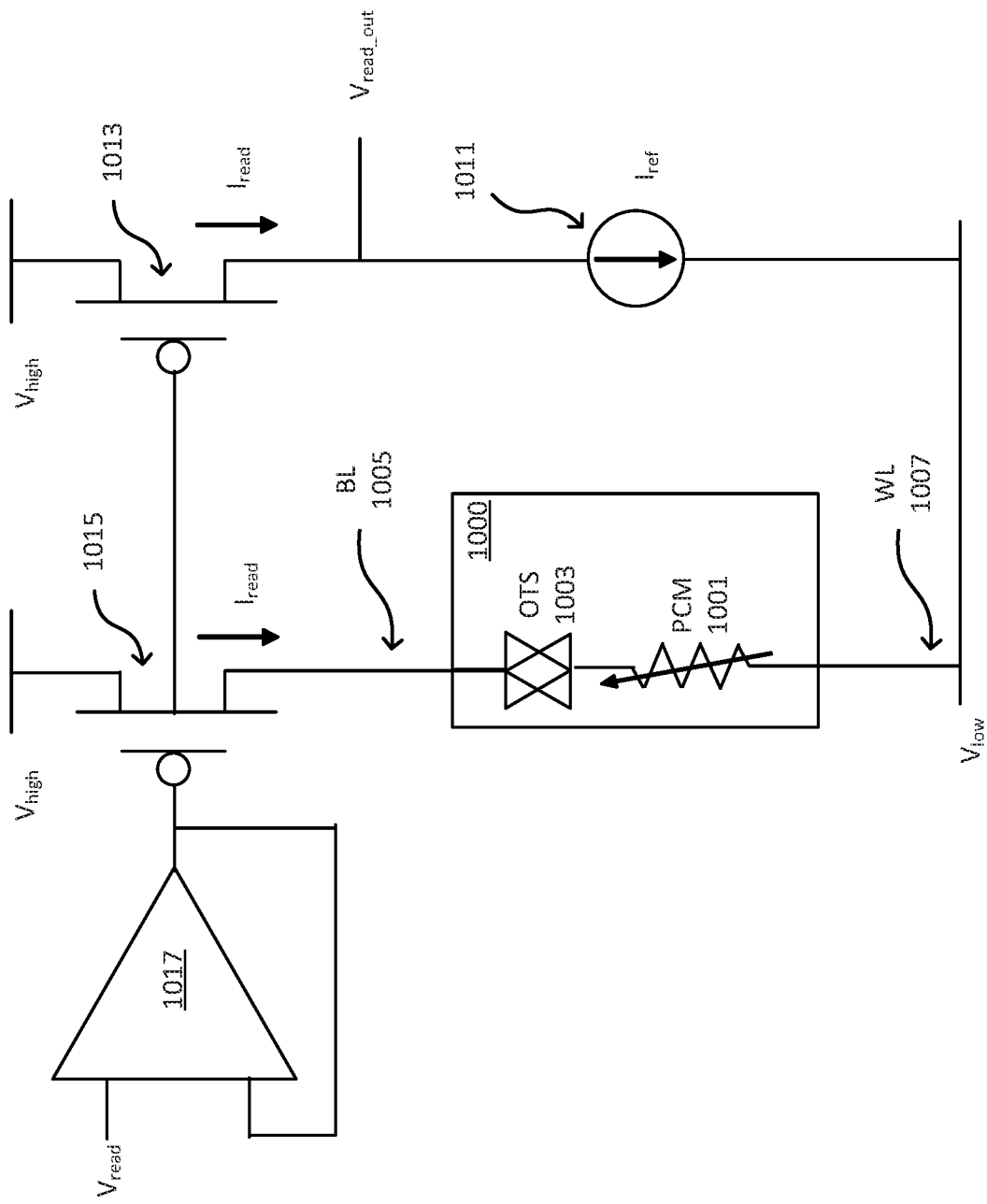
FIG. 10B shows one embodiment for read circuitry such as can be incorporated in the read circuit of FIG. 5.
Figure 10C:
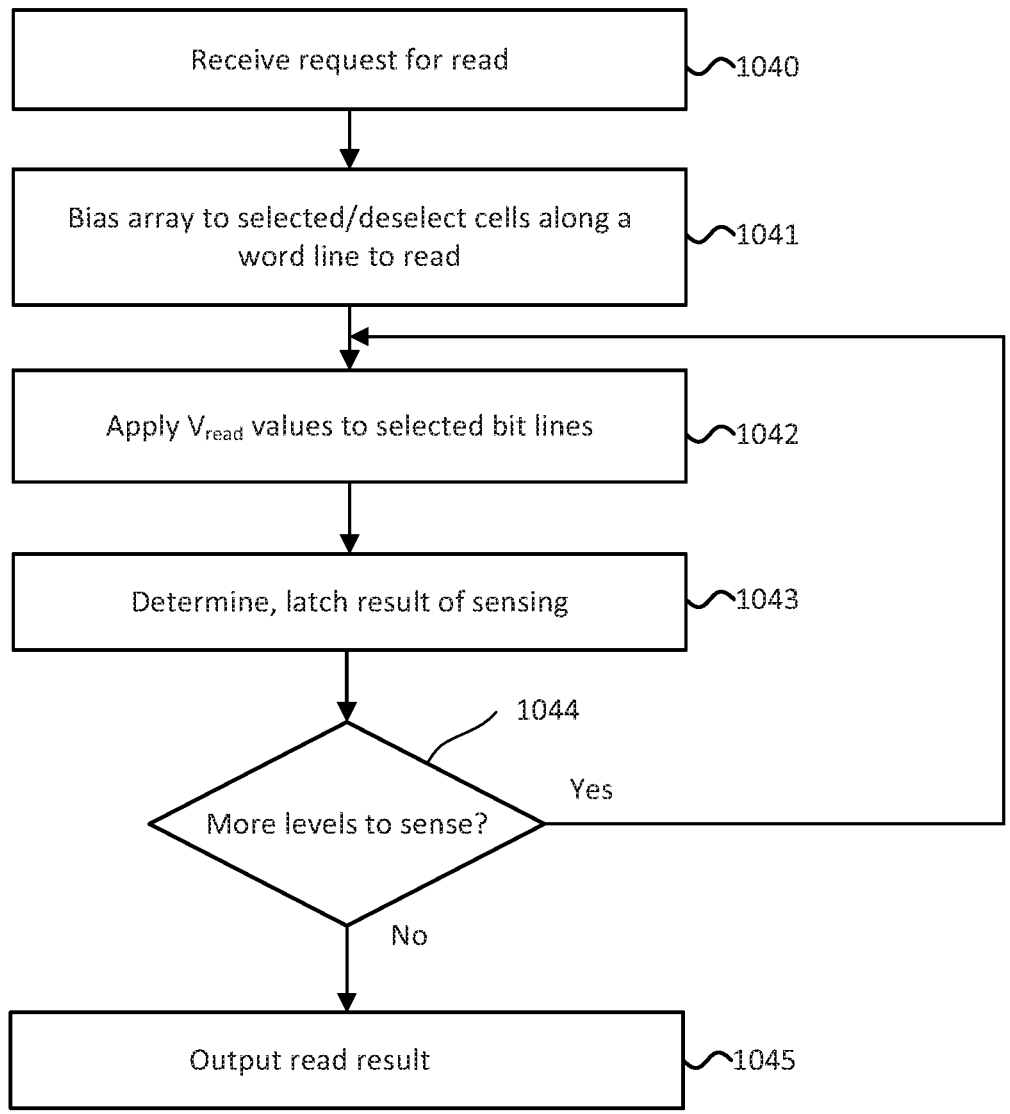
FIG. 10C is a flowchart describing an embodiment for reading an array of multi-state PCM material based memory cells.

FIGS. 10A-10C consider the reading of multi-state memory cells for the PCM memory structure described with respect to FIG. 1A-8. FIG. 10A illustrates the current-voltage characteristics of a PCM based memory cell for the PCM material alone, or PCM material and surfactant, and for when the ovonic threshold switch (OTS) is included. In this example, four states are shown, but other embodiments can have larger or smaller numbers of states per memory cell. At left are the curves for the PCM material or PCM material and surfactant alone, without the OTS selection device. At farthest left, the dashed line of trace 1020 is for a crystalline state, followed by the dashed line curves of three states with increasing levels of the PCM material in the amorphous state at 1021, 1022 and 1023. The current increase linearly until the threshold voltage is reached, at which the cell is conductive, as shown at $V_{th\_PCM1}$, $V_{th\_PCM2}$ and $V_{th\_PCM1}$ for 1021, 1022 and 1023.

To the right in FIG. 10A, at left are the solid lines for the I-V curves for when the OTS material is now included, with 1030 corresponding to when the PCM material in the memory cell is in crystalline (or set) state, followed by three states with increasing levels of the PCM material in the amorphous state at 1031, 1032 and 1033. For each of 1030-1033, the I-V curves initially increase linearly together until they separate as the OTS material of the memory cell become conducting. As the I-V curves 1030-1033 separate, they increase linearly until they reach their respective threshold voltages, at which the cell is conductive. The threshold voltage for the crystalline (or set) phase is shown at $V_{th\_set}$ for 1030, with the threshold voltages for increasing levels of amorphous (or reset) phase PCM material shown at $V_{th\_reset1}$, $V_{th\_reset2}$ and $V_{th\_reset1}$ for 1031, 1032 and 1033. The voltage levels $V_{read1}$, $V_{read2}$ and $V_{read3}$ can be used to discriminate between the memory cells' data states. If the program operation of FIG. 9C uses multiple current pulses with inter-pulse verify operations, the voltage levels $V_{read1}$, $V_{read2}$ and $V_{read3}$ or values somewhat offset from these levels can be used in verify sensing operations.

FIG. 10B shows one embodiment for read circuitry such as can be incorporated in the read circuit 566 of FIG. 5 for the PCM memory structure described with respect to FIGS. 1A-8. FIG. 10B shows a portion of the write circuitry connected to a single selected memory cell 1000. Decoding and select circuitry, such as column decoder 504 in FIG. 5, and other elements are omitted in FIG. 10B to simplify the discussion. The read circuit 566 of FIG. 5 would typically have multiple copies of the write circuitry elements illustrated in FIG. 9A connected through decoding circuitry to be able to concurrently read multiple memory cells.

The selected memory cell 1000 in this embodiment includes a phase change memory material PCM 1001 connected in series with an ovonic threshold switch OTS 1003 between a bit line BL 1005 and word line WL 1007. The state of the memory cell 1000 is read by applying a current $I_{read}$ through the memory cell 1000. In the shown embodiment, the word line WL 1007 is placed at a low voltage level, such as ground, and the current $I_{read}$ is applied from the read circuitry to the bit line BL 1005. The current $I_{read}$ is provided by the transistor 1015 that is connected between the bit line BL 1005 and a high voltage level, where this can be a regulated supply level on the memory circuity. The voltage on the gate of the transistor 1115 is applied by a driver 1117 as determined by the read voltage level $V_{read}$ on the input of the driver 1117, where $V_{read}$ can be the voltage levels $V_{read1}$, $V_{read2}$ and $V_{read3}$ of FIG. 10A used to differentiate the memory cell data states illustrated in FIG. 10A. If $V_{read}$ is above the threshold voltage of the memory cell, it will conduct resulting in a high $I_{read}$ value, while if $V_{read}$ is below the threshold voltage of the memory cell, it will not conduct resulting in a low $I_{read}$ value.

The current $I_{read}$ through transistor 1015 is mirrored in transistor 1013, which is connected between the high and low voltage levels in series with a reference current source 1011 providing $I_{ref}$. In this embodiment, the transistors 1013 and 1015 are implemented as PMOS devices. In a symmetric current mirror, where transistors are of the same width/length, $I_{read}$ will be the same in 1013 and 105, but different ratios can be obtained by varying the relative device sizes. If $I_{read}$ in transistor 1013 is higher than $I_{ref}$, the sensing output voltage $V_{read\_out}$ will be high, while if the current $I_{read}$ in transistor 1013 is lower than $I_{ref}$, the sensing output voltage $V_{read\_out}$ will be low. The result of the read operation can be sent out as output data at Data Out for the read/write circuits 502 of FIG. 5 or stored in the data latch 568.

FIG. 10C depicts a flowchart describing an example of an embodiment of processes for reading an array of phase change memory material based memory cells based on the write circuitry of FIGS. 5 and 10B. At step 1040, the memory device receives a read request. In most memory systems, this will be from the controller in terms of physical addresses, but in other embodiments this can be a logical address that is converted to a physical address by control circuitry on the memory device. The array is biased for the sensing operation in step 1041, where the biasing can again be as shown in FIG. 5 and described with respect to step 922 of FIG. 9C, with a selected word line at a low voltage level, such as ground, and the non-selected word lines at a high enough voltage to avoid current from a selected bit line flowing onto the non-selected word lines. It should be noted that although the cross-sectional view of the vertical cross point structure illustrate in FIG. 7A bears some resemblance to a 3D NAND array (such as a BiCS structure), the cells along a bit line not connected in series and can individually be accessed. This allows for any of the memory cells along a selected word line to be read currently in a read process, so that a read page can be an entire word line or some portion of a word line, where the page size can be chosen based on performance and power considerations.

Once the array is based, the selected memory cells can be read in steps 1042, 1043 and 1044. At step 1042, a sensing operation is performed by applying a $V_{read}$ value to the driver 1117 of FIG. 10B, where this can be one of the read voltage levels $V_{read1}$, $V_{read2}$ or $V_{read3}$ of FIG. 10A for a 4-state per memory cell embodiment. After applying $I_{read}$ for some time, the result of the sensing operation can then be determined at step 1043 based on the $V_{read\_out}$ level and latched in the latch circuits of data latch 568. Step 1044 determines if more sensing operation for other data levels or other memory cells are to be performed and, if so, the flow loops back to step 1042 for the next sensing operation with a shifted $V_{read}$ value if a different state is to be sensed. When reading multi-state data, different orders for reading the data states can be used depending on the embodiment for the read algorithm. To take one example, the sensing operation on the first time through step 1042 could be for the lowest level of $V_{read1}$, followed by $V_{read2}$ the next time through and finally $V_{read3}$, where, to save on power consumption, if a memory cells is found to conducting at one $V_{read}$ value, it can be omitted from sensing in subsequent iterations. Once all of the levels to be sensed are sensed, the read result is output at step 1045.

Figure 11F:
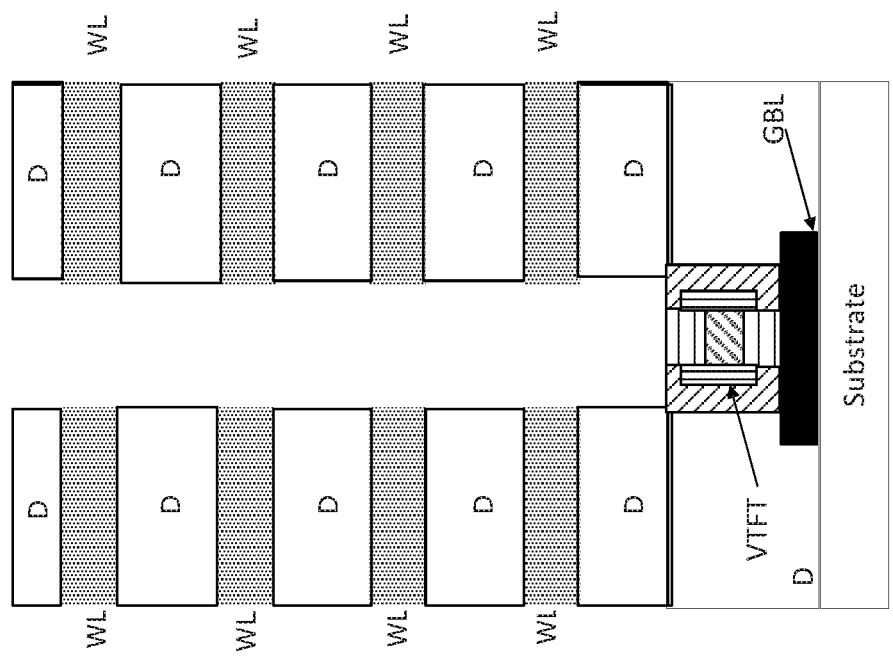
Figure 11E:
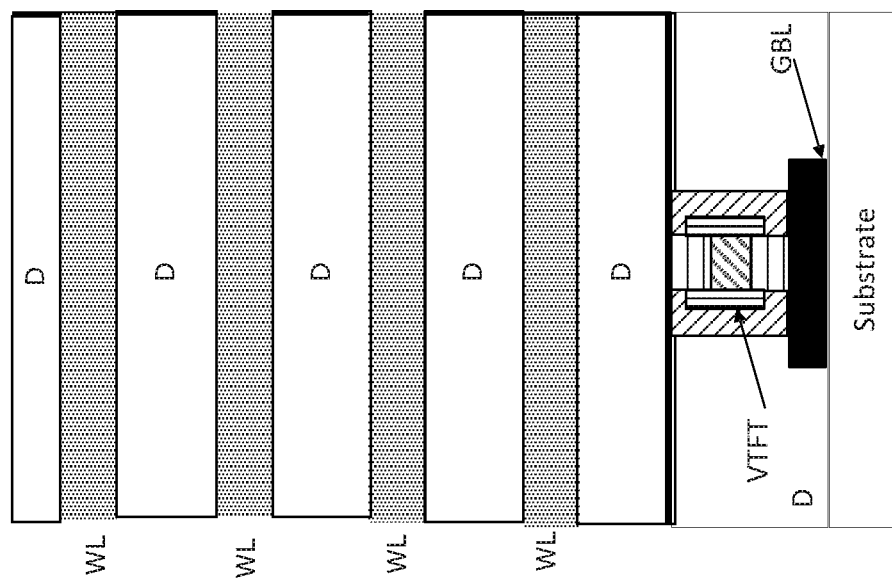
Figure 11H:
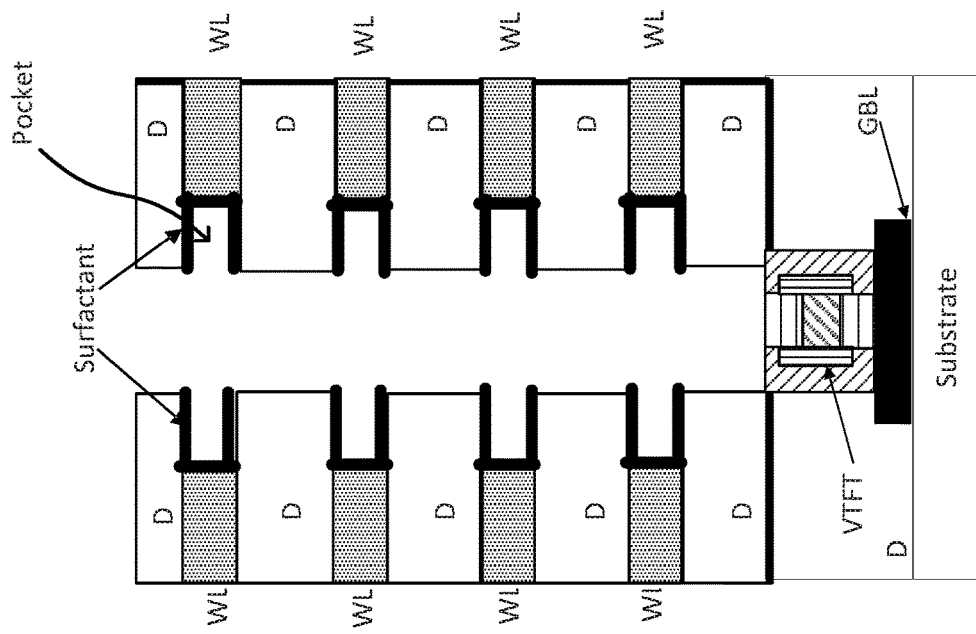
Figure 11G:
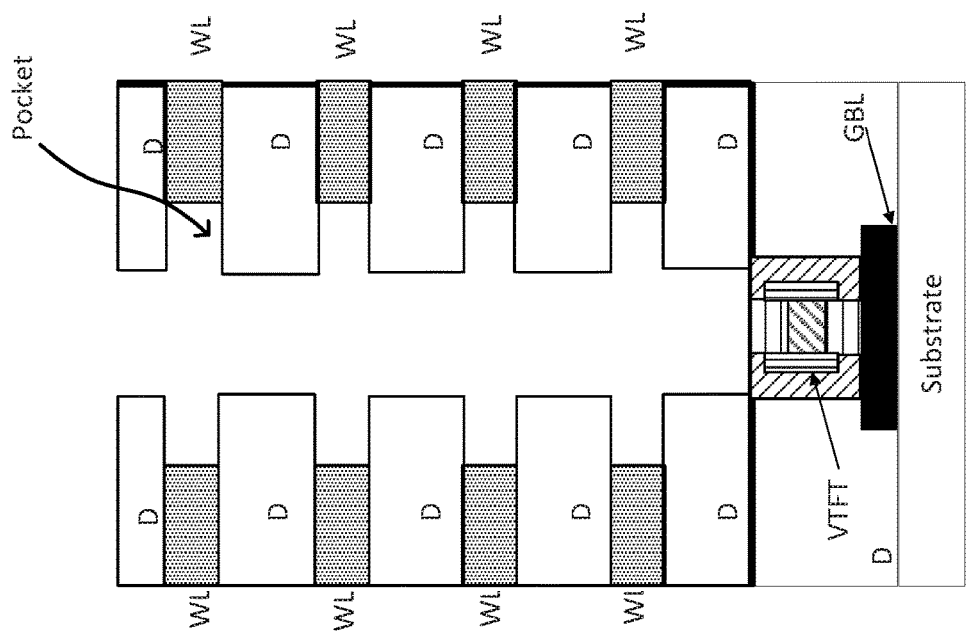
Figure 11I:
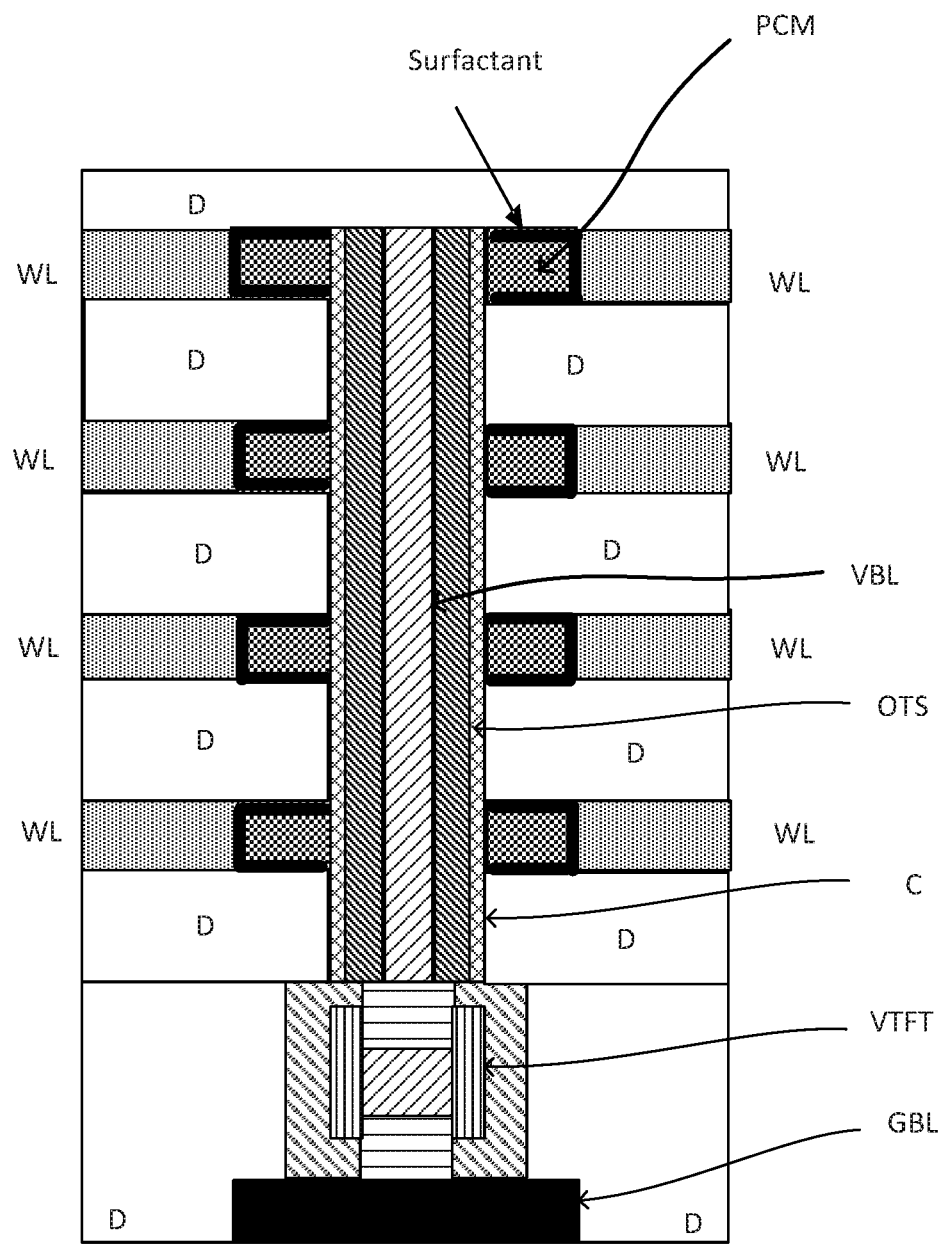
Figure 11J:
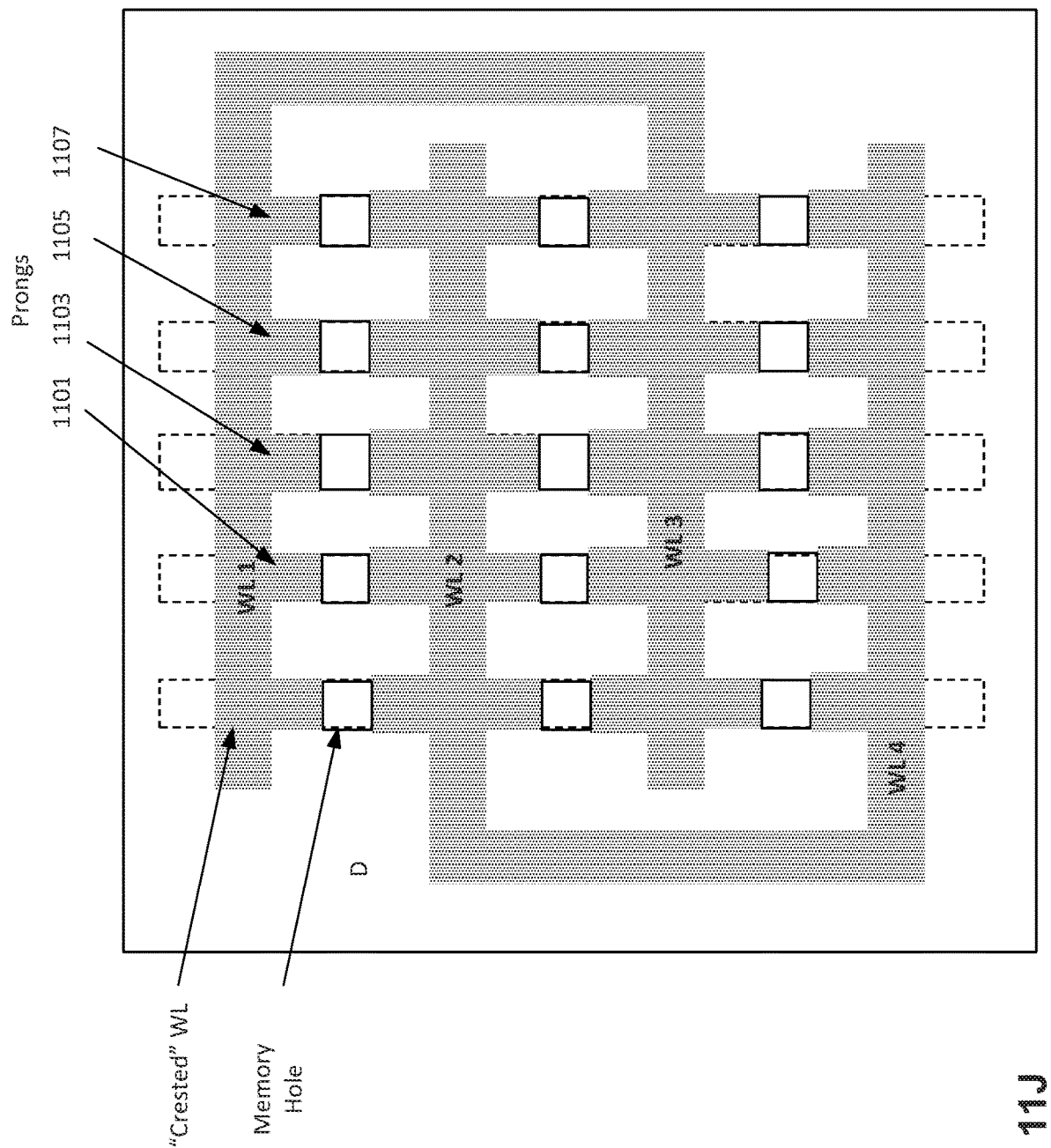
Figure 11K:
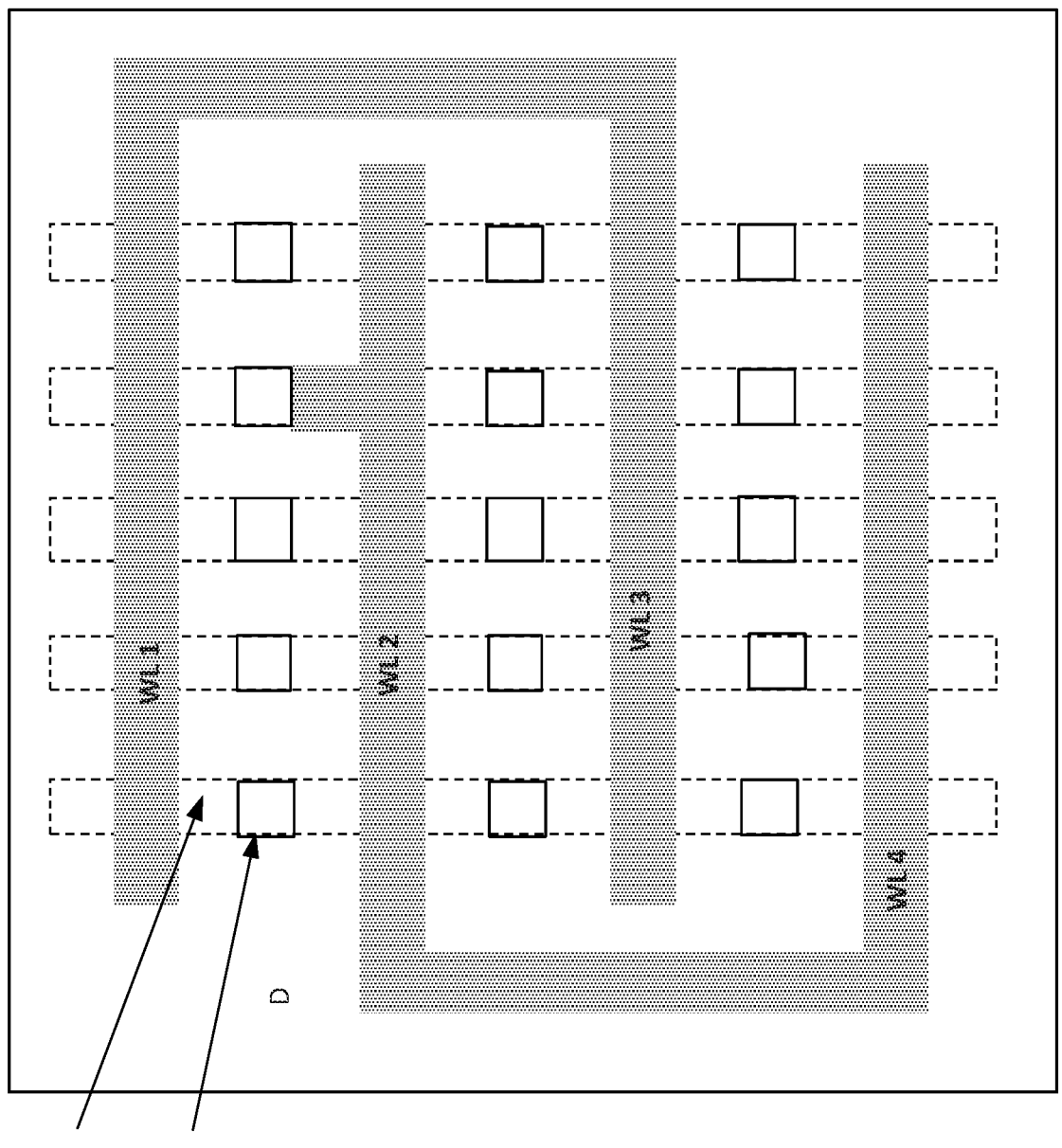
Figure 11L:
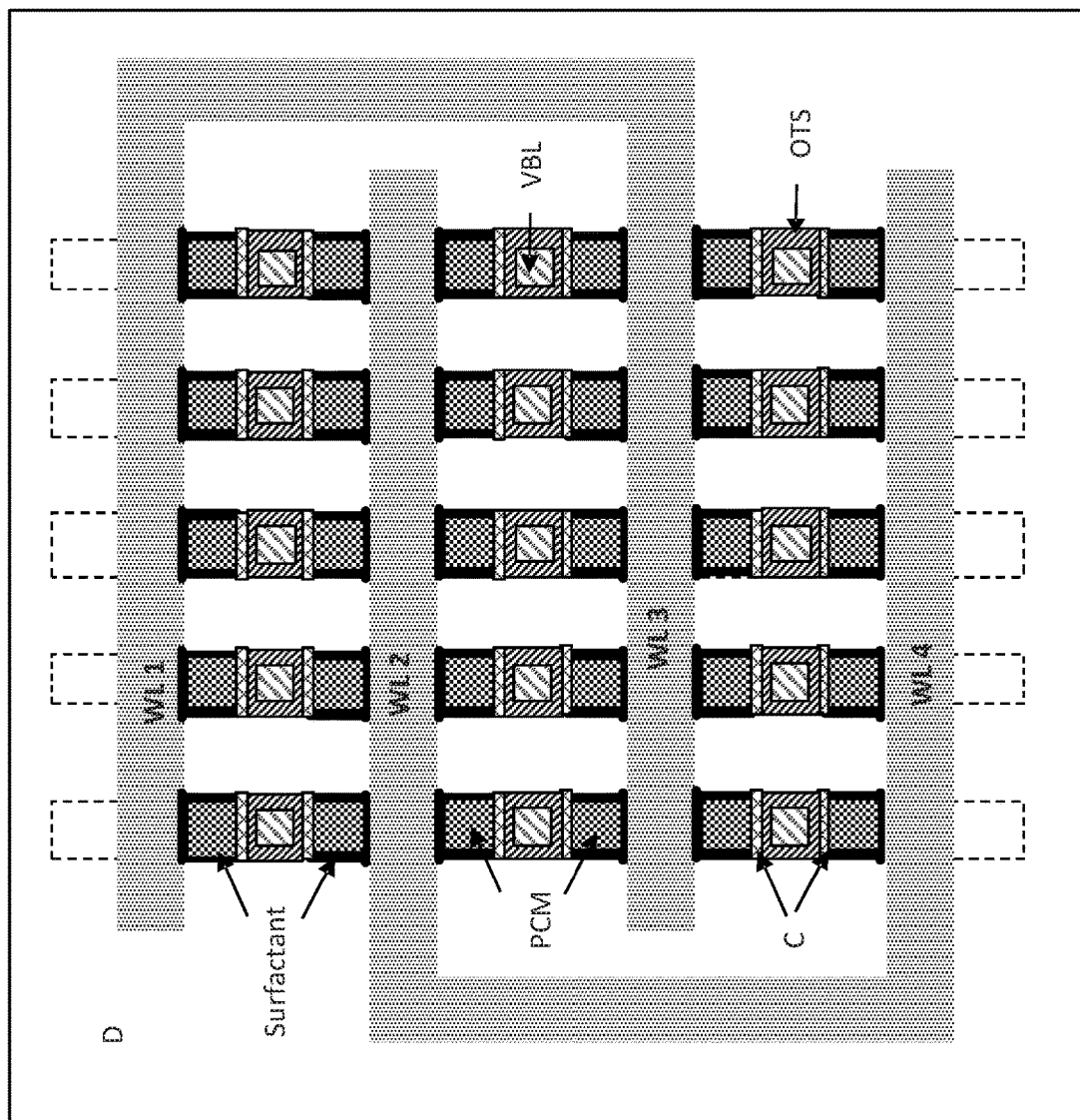

FIGS. 11A-11I may depict various stages of fabrication using cross-sectional views for the embodiment of FIGS. 7A-7C. FIGS. 11J-11L show a top view at a word line layer of a portion of one embodiment for various stages of fabrication for the embodiment of FIGS. 7A and 7B. FIGS. 11A-11L may be referred to when describing the process of FIG. 12.

Figure 12:
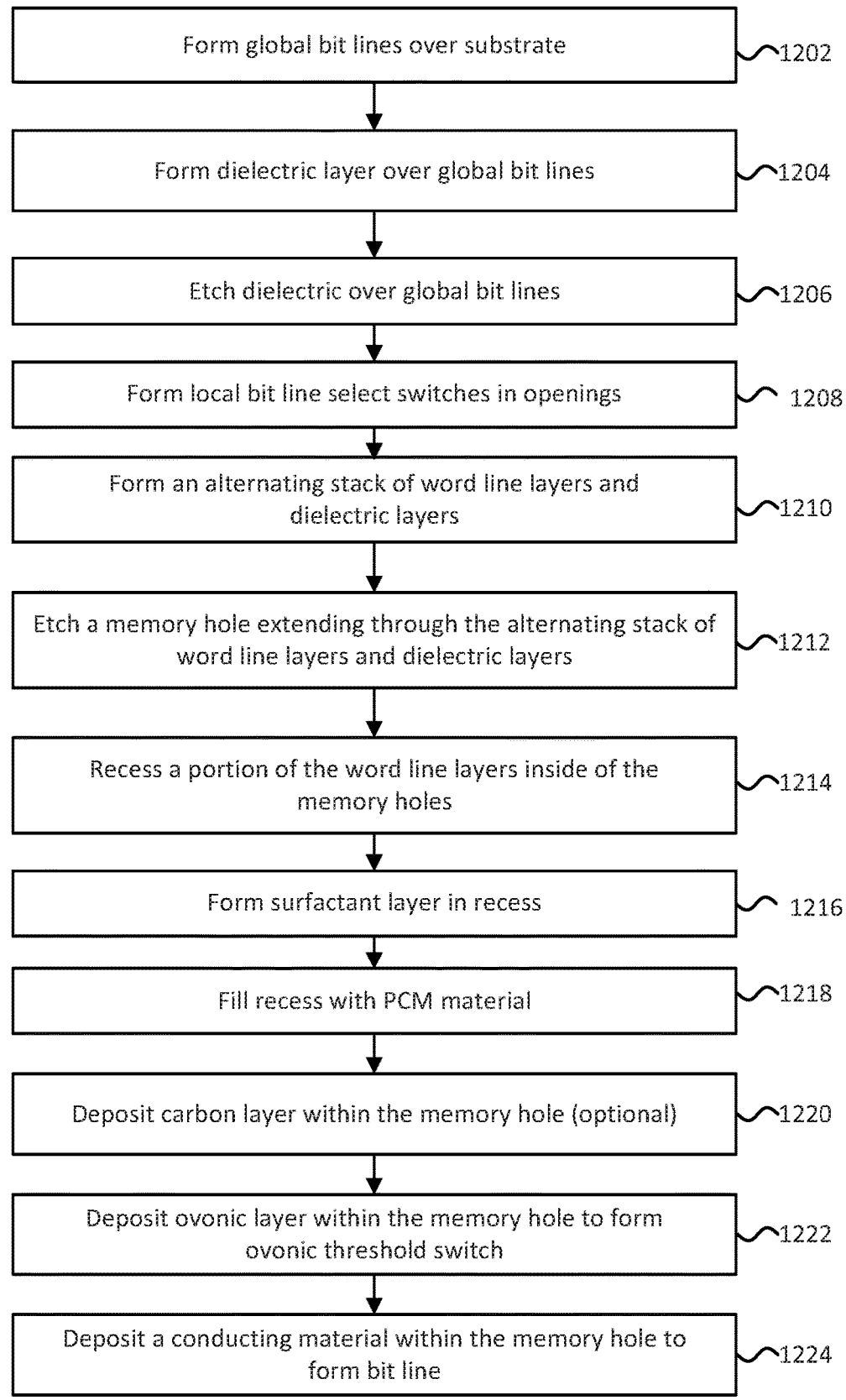
FIG. 12 depicts a flowchart describing embodiments of processes for forming portions of a memory array as in FIGS. 7A and 7B.

FIG. 12 depicts a flowchart describing an example of an embodiment of processes for forming portions of a memory array. The flowcharts may omit common processing steps (e.g., the formation of isolation regions or structures, various implant and annealing steps, the formation of vias/contacts, the formation of a passivation layer, planarization, etc.) in order to highlight the processing steps described.

Referring to FIG. 12, in step 1202 global word lines GBL are formed over a substrate, as illustrated in FIG. 11A. The global bit lines may be formed over an n+ polysilicon layer or positioned above a substrate, such as a silicon substrate or glass substrate. In some embodiments, the region under the lower dielectric layer and global bits lines can includes CMOS or other circuit elements (decoders, drivers, and so on) for operation of the array. At step 1204, a layer of dielectric D is formed over the global bit lines GBL, as shown in FIG. 11B, and at 1206 an opening etched to expose the global bit lines where the vertical local bit lines will later be located, with the resultant structure shown in FIG. 11C. A switch for connecting the global bit line GBL to the corresponding subsequently formed local bit lines is formed at step 1208. FIG. 11D shows the resultant structure for an embodiment using a vertical thin film transistor (VTFT) for this switch, but other switch types can be used.

In step 1210, an alternating stack of word line layers WL and dielectric layers D are formed. The alternating stack of word line layers and dielectric layers may comprise an alternating stack of TiN or polysilicon that are separated by layers of oxide or silicon dioxide. The alternating stack of word line layers and dielectric layers may be formed over the previously formed one or more global bit lines or above a global bit line layer. The alternating stack of word line layers and dielectric layers may be deposited using various deposition techniques such as chemical vapor deposition (CVD), physical vapor deposition (PVD), or atomic layer deposition (ALD). FIG. 11E illustrates an example of this structure.

In step 1212, a memory hole or trench is etched extending through the alternating stack of word line layers and dielectric layers. The memory hole or trench may be etched using various etching techniques such as dry etching, wet chemical etching, plasma etching, or reactive-ion etching (ME). An example of the resultant structure is shown in FIG. 11F. Depending on the embodiment, the word line regions on either side of a trench may be separate or connected in the case of a memory hole. The word line layers may comprise a layer of TiN, polysilicon, titanium, tantalum, or tungsten (W). The dielectric layers include dielectric layer may comprise a layer of silicon dioxide.

In an embodiment using "crested" word line structure (word lines with extending prongs), after step 1212 the top view corresponding to that of FIG. 7B is shown in FIG. 11J. Each of the word lines has a series of prongs extending outwards towards the memory hole regions in which the vertical bit line structure will later be formed.

The prongs, such as 1101-1107, can be formed in a variety of ways. In one embodiment, the structure shown in FIG. 11J is formed by initially forming the word lines shown running horizontally, the vertical connectors for the comb structures with prongs such as 1101-1107 and sections that run vertically in FIG. 11J. The sections running vertically in FIG. 11J can be divided to form the prongs 1101-1107 by etching memory holes in the locations indicated that are configured to remove word line material in the memory hole and form prongs 1101-1107. Alternately, in other embodiments the prongs 1101-1107 can be formed using masking techniques when the word line combs 1101-1107 are formed.

Referring to FIG. 12, in step 1214, a portion of the word line layers is recessed by etching the word line layers from the memory holes back from the memory hole relative to the dielectric layers on either side. The word line layers may be recessed using a selective etch that targets the material of the word line or a timed etch which etches the material of the word line at a faster rate than the material of the dielectric. Referring to FIG. 11G, a portion of the word line layers has been recessed or removed, to form a pocket recessed relative to a vertical face of the dielectric layers.

In embodiments using the "crested" word line structure, after step 1214 the top view corresponding to that of FIG. 7B is shown in FIG. 11K. This top view is at a word line layer, where the prongs have now been etched back in the word line layer to form the recessed pocket within the surrounding dielectric layers, both above and below (in the vertical directions) and to the sides (laterally, separating adjacent memory cells on the same word line).

In step 1216, the portion of the word line layers that was recessed to form a pocket is lined with a surfactant, such as a metal-nitride. Referring to FIG. 11H, the portion of the word line layers has been filled with surfactant in each of the word line pockets, such as by the deposition of a conformal surfactant and subsequent etch to remove any surfactant on side-walls of memory hole, where this subsequent etch can be omitted in some embodiments if the resistivity of the surfactant is not too low. The surfactant layer can be applied by, for example, an electroplating process, an atomic layer deposition (ALD), an Electrochemical Atomic Layer Deposition (E-ALD), or other processes. FIG. 11H again shows the underlying global bit line GBL and the vertical thin film transistor VTFT of one embodiment.

In step 1218, the recessed pocket region in the word line is filled by the deposition of a conformal phase change memory material to form the memory cell. Depending on the embodiment, the phase change material can be deposited by, for example, using an electroplating process, an atomic layer deposition (ALD), an Electrochemical Atomic Layer Deposition (E-ALD), or other processes. In filling the pocket region to form the confined PCM material of the memory cell, the PCM material may have also filled in the trench or memory hole region as well, where the amount to which this occurs will be process dependent. The trench or memory hole may then need to be cleaned up to re-establish the trench or memory hole region by removed the PCM material to form the individual memory cells with in each of the recessed pockets before forming the vertical bit line structure. Once the memory hole or trench region is cleaned up, in embodiments that include the conformal carbon layer C, this is then deposited in step 1220. The carbon layer C is substantially an insulating layer, since although it should allow current to pass between the PCM material and the ovonic threshold switch layer, if the C layer is not sufficiently resistant it can short the memory cells on different layers together without going through the PCM material.

Formation of an ovonic threshold switch layer OTS follows in step 1222, which is then etched followed by the deposition of the vertical bit line VBL in step 1224. An example of the resultant structure is shown in cross-section in FIG. 11I, which correlates to FIG. 7A. For embodiments using a "crested" word line structure, the top view of the resultant structure is shown in FIG. 11K, which corresponds to FIG. 7B. The vertical bit line VBL of step 1224 can be a conducting material (e.g., tungsten) that is deposited within the trench in one embodiment, or memory hole in another embodiment.

The various embodiments described above provide for a non-volatile memory using a phase change memory material with increased storage densities. More specifically, the vertical cross-point structure allows for a three-dimensional array of memory cells and the use of a surfactant allows for more reliable multi-state storage.

In some embodiments, a method of forming a non-volatile memory structure includes forming alternating horizontal layers of a plurality of dielectric layers and one or more word lines layers and etching a vertical region through the alternating horizontal layers of word line layers and dielectric layers. The word lines are etched horizontally from the vertical region to form regions recessed from the vertical region within the dielectric layers. A phase change memory material is within the recessed regions and a vertical bit line is formed within the vertical region.

In further embodiments, a method includes forming a first dielectric layer on a substrate and forming a patterned conductive layer on the first dielectric layer, the patterned conductive layer having a plurality of prongs extending horizontally relative to the substrate. A second dielectric layer is formed over patterned conductive layer the second dielectric layer is etched into vertically relative to the substrate to expose the ends of the prongs. The exposed ends of the prongs are etched block horizontally relatively to the substrate to from a corresponding plurality of pores in the first and second dielectric layers. A phase change memory material is formed within the pores and one or more conducting lines running vertically with respect to the substrate are formed, the phase change memory material within each of the pores connected between the conductive layer and one of the conducting lines as part of a memory cell.

In additional embodiments, a method includes forming a word line running horizontally between dielectric layers and forming a bit line running vertically through the dielectric layers. A memory cell is formed connected horizontally between the word line and the bit. Forming the memory cell includes forming a pocket within the dielectric layers exposing the word line; forming a phase change memory material within the pocket configured to provide a first current path between the word line and the bit line, the phase change memory material having a first phase with a first resistivity and a second phase with a second resistivity, the first resistivity being higher than the second resistivity; and forming an intermediate resistance material adjacent to the phase change memory material within the pocket configured to provide a second current path is parallel with the first current path between the word line and the bit line, the intermediate resistance material having a resistivity higher than the second resistivity and lower than the first resistivity.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of zero or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising: forming a first dielectric layer on a substrate;
    forming a patterned conductive layer on the first dielectric layer,
        the patterned conductive layer having a plurality of prongs extending horizontally relative to the substrate;
    forming a second dielectric layer over patterned conductive layer;
    etching into the first and second dielectric layers vertically relative to the substrate to expose ends of the prongs;
    etching back the exposed ends of the prongs horizontally relative to the substrate to form a corresponding plurality of pores in the first and second dielectric layers,
        the pores surrounded by the first and second dielectric layers above, below and laterally on both sides;
    lining the pores with a surfactant;
    forming a phase change memory material within the pores lined with the surfactant,
        the phase change memory material formed within the pores lined with the surfactant such that the phase change material is separated from the surrounding first and second dielectric layers and the patterned conductive layer by the surfactant; and
    forming one or more conducting lines running vertically with respect to the substrate,
        the phase change memory material within each of the pores connected between the conductive layer and one of the conducting lines as part of a memory cell.

2. The method of claim 1, wherein the surfactant comprises a metal-nitride.

3. The method of claim 1, wherein lining the pores with the surfactant includes an electroplating process.

4. The method of claim 1, wherein forming the phase change memory material within the pores includes an electroplating process.

5. The method of claim 1, wherein the phase change memory material is a chalcogenide material.

6. The method of claim 5, wherein the chalcogenide material is $Ge_2Sb_2Te_5$ (GST).

7. The method of claim 1, further comprising:
    forming an ovonic threshold switch between the phase change memory material in each of the pores and the corresponding one of the conducting lines.

8. The method of claim 7, further comprising:
    forming a diffusion barrier layer between the phase change memory material and the ovonic threshold switch.

9. The method of claim 8, where the diffusion barrier layer includes a carbon layer.

10. The method of claim 1, further comprising:
    forming a global bit line on the substrate; and
    forming a switch,
    wherein the first dielectric layer is formed over the global bit line and the switch and the switch connects one of the conducting lines to the global bit line.

11. The method of claim 10, wherein the switch is a vertical thin film transistor.

12. A method, comprising: forming a plurality of dielectric layers on a substrate;
    forming one or more patterned conductive layers between each the dielectric layers,
        each of the patterned conductive layers having a plurality of prongs extending horizontally relative to the substrate;
    etching into one or more of the dielectric layers vertically relative to the substrate to expose ends of the prongs;
    etching back the exposed ends of the prongs horizontally relative to the substrate to form a corresponding plurality of pores in the dielectric layers,
        the pores surrounded by the dielectric layers above, below and laterally on both sides;
    lining the pores with a surfactant;
    forming a phase change memory material within the pores lined with the surfactant,
        the phase change memory material formed within the pores lined with the surfactant such that the phase change material is separated from the surrounding dielectric layers and the patterned conductive layers by the surfactant; and
    forming one or more conducting lines running vertically with respect to the substrate,
        the phase change memory material within each of the pores connected between the conductive layer and one of the conducting lines as part of a memory cell.

13. The method of claim 12, wherein the surfactant comprises a metal-nitride.

14. The method of claim 12, wherein lining the pores with the surfactant includes an electroplating process.

15. The method of claim 12, wherein the phase change memory material is a chalcogenide material.

16. The method of claim 15, wherein the chalcogenide material is $Ge_2Sb_2Te_5$ (GST).

17. The method of claim 12, further comprising:
    forming an ovonic threshold switch between the phase change memory material in each of the pores and the corresponding one of the conducting lines.

18. The method of claim 17, further comprising:
    forming a diffusion barrier layer between the phase change memory material and the ovonic threshold switch.

19. The method of claim 18, where the diffusion barrier layer includes a carbon layer.

20. The method of claim 12, further comprising:
    forming a global bit line on the substrate; and
    forming a switch,
    wherein a first of the dielectric layers is formed over the global bit line and the switch and the switch connects one of the conducting lines to the global bit line.

* * * * *